(12) United States Patent
Chiang et al.

(10) Patent No.: US 10,995,179 B2
(45) Date of Patent: May 4, 2021

(54) POLYIMIDE RESIN AND METAL-CLAD LAMINATE COMPRISING THE SAME

(71) Applicant: ETERNAL MATERIALS CO., LTD., Kaohsiung (TW)

(72) Inventors: Shun-Jen Chiang, Kaohsiung (TW); Chung-Jen Wu, Kaohsiung (TW); Po-Yu Huang, Kaohsiung (TW); Meng-Yen Chou, Kaohsiung (TW); Chang-Hong Ho, Kaohsiung (TW); Chun-Kai Cheng, Kaohsiung (TW)

(73) Assignee: ETERNAL MATERIALS CO., LTD, Kaohsiung (TW)

( * ) Notice: Subject to any disclaimer, the term of this patent is extended or adjusted under 35 U.S.C. 154(b) by 240 days.

(21) Appl. No.: 15/185,895

(22) Filed: Jun. 17, 2016

(65) Prior Publication Data
US 2016/0369053 A1    Dec. 22, 2016

(30) Foreign Application Priority Data

Jun. 17, 2015   (TW) ................................. 104119714
Dec. 4, 2015    (TW) ................................. 104140909
Apr. 29, 2016   (TW) ................................. 105113634

(51) Int. Cl.
*C08G 73/10* (2006.01)
*B32B 15/08* (2006.01)
(Continued)

(52) U.S. Cl.
CPC ............ *C08G 73/1042* (2013.01); *B32B 7/12* (2013.01); *B32B 15/08* (2013.01); *B32B 15/20* (2013.01); *B32B 27/08* (2013.01); *B32B 27/18* (2013.01); *B32B 27/281* (2013.01); *C08G 73/106* (2013.01); *C08G 73/1082* (2013.01);
(Continued)

(58) Field of Classification Search
CPC ............ C08G 73/1042; C08G 73/1082; C08G 73/106; H05K 3/0097; H05K 1/0353; H05K 2203/0143; H05K 3/022; H05K 2203/1545; H05K 2201/0154; B32B 15/08;
(Continued)

(56) References Cited

U.S. PATENT DOCUMENTS 4,586,997 A * 5/1986 Lee ...................... C08G 77/455
                                                  427/387
6,251,507 B1    6/2001 Yamamoto et al.
(Continued)

FOREIGN PATENT DOCUMENTS

CN    1582318 A      2/2005
CN    101786354 A    7/2010
(Continued)

OTHER PUBLICATIONS

Non-English Office Action and Search Report dated Oct. 26, 2016 for Taiwan Application No. 105113634 and English translation of the Search Report.
(Continued)

*Primary Examiner* — John D Freeman
(74) *Attorney, Agent, or Firm* — Ladas & Parry LLP

(57) ABSTRACT

The present disclosure provides a polyimide resin having at least two glass transition temperatures measured by dynamic mechanical analysis (DMA). Also, a metal-clad laminate including the polyimide resin.

16 Claims, 1 Drawing Sheet

(51) Int. Cl.
| | |
|---|---|
| *B32B 27/28* | (2006.01) |
| *C09D 179/08* | (2006.01) |
| *H05K 1/03* | (2006.01) |
| *H05K 3/00* | (2006.01) |
| *B32B 7/12* | (2006.01) |
| *B32B 27/18* | (2006.01) |
| *B32B 27/08* | (2006.01) |
| *B32B 15/20* | (2006.01) |
| *H05K 3/02* | (2006.01) |

(52) U.S. Cl.
CPC ......... *C09D 179/08* (2013.01); *H05K 1/0353* (2013.01); *H05K 3/0097* (2013.01); *B32B 2250/40* (2013.01); *H05K 3/022* (2013.01); *H05K 2201/0154* (2013.01); *H05K 2203/0143* (2013.01); *H05K 2203/1545* (2013.01)

(58) Field of Classification Search
CPC ......... B32B 27/281; B32B 7/12; B32B 27/18; B32B 27/08; B32B 15/20; C09D 179/08
See application file for complete search history.

(56) References Cited

U.S. PATENT DOCUMENTS

| | | | |
|---|---|---|---|
| 2005/0054776 | A1 | 3/2005 | Itou et al. |
| 2007/0044910 | A1 | 3/2007 | Kuo et al. |
| 2014/0357796 | A1* | 12/2014 | Donovan ................ C08L 79/08 525/151 |

FOREIGN PATENT DOCUMENTS

| | | | | |
|---|---|---|---|---|
| CN | 105500828 | A | 4/2016 | |
| GB | 1138091 | A * | 12/1968 | ............ C08G 69/32 |
| JP | 6-112610 | A | 4/1994 | |
| JP | 6-329798 | A | 11/1994 | |
| JP | 2004-322636 | A | 11/2004 | |
| JP | 2009-132154 | A | 6/2009 | |
| JP | 2012-255107 | A | 12/2012 | |
| TW | 201434973 | A | 9/2014 | |

OTHER PUBLICATIONS

English translation of CN 105500828 A.
Espacenet English abstract of TW 201434973 A.
Espacenet English abstract of CN 101786354 A.
Non-English Korean Office Action dated Jun. 13, 2017 for Korean Application No. 10-2016-0076091with English translation.
Non-English Japanese Office Action dated Jul. 26, 2017 with English translation for Japanese Application No. 2016-121200.
Espacenet English abstract of JP 2009-132154 A.
Espacenet English abstract of JP 2004-322636 A.
Espacenet English abstract of JP 2012-255107 A.
Espacenet English abstract of JP 6-329798 A.
Espacenet English abstract of JP 6-112610 A.
Furukawa, N., et al., "Adhesive Properties of Siloxane Modified Polyimides and Application for Multi-Layer Printed Circuit Boards", J. Adhesion, vol. 59, , 1996, pp. 281-294.
M. Niwa, et al.: Preparation of Novel Fluorinated Block Copolyimide Membranes for Gas Separation. In: J. Applicant. Polym. Sci. 2006, vol. 100, pp. 2436-2442. ISSN 1097-4628.
Office Action issued in foreign counterpart German Patent Application No. 10 2016 210 871.9 with English translation thereof.

* cited by examiner

POLYIMIDE RESIN AND METAL-CLAD LAMINATE COMPRISING THE SAME

CROSS REFERENCE TO THE RELATED APPLICATIONS

This application claims the benefit of priority to Taiwan Patent Application Nos. 104119714 filed Jun. 17, 2015, 104140909 filed Dec. 4, 2015 and 105113634 filed Apr. 29, 2016, the contents of which are incorporated herein by reference in their entity.

BACKGROUND OF THE INVENTION

1. Technical Field

The present disclosure relates to a polyimide resin. In particular, the present disclosure relates to a polyimide resin applicable to a metal clad laminate.

2. Description of the Related Art

A flexible printed circuit (FPC) board is made from the raw materials of a flexible insulation layer and copper foil which have the capacity to endure bending deformation. Due to its flexibility and bendability, FPC enables three-dimensional wiring through adaptation to the size and shape of the product and is light and thin, making it one of the essential components in various high-tech devices such as cameras, video cameras, displays, disk drives, printers, mobile phones and other such devices. The properties of raw materials affect the performance of the FPC and the capacity of raw material supply affect the yield of the FPC. The raw materials used in a FPC include resin, copper foil, adhesive, coverlay, flexible copper clad laminate (FCCL). Polyimide is superior in ductility, coefficient of thermal expansion, thermal stability and mechanical property, etc., and is thus a common resin material for FPC.

A flexible metal clad laminate, for example, flexible copper clad laminate (FCCL), is an upstream material for a flexible printed circuit board. The existing FCCLs may be divided, in light of their structures, into three-layer FCCLs (3 L FCCLs) with adhesive and two-layer FCCLs (2 L FCCLs) without adhesive. The 2 L FCCL is made by a special process, contains no low heat-resistant adhesives such as epoxy or acrylate resins, and is thus more reliable. Moreover, 2 L FCCL is better suited to development of thinner products, and thus is gradually replacing 3 L FCCL in practice.

The FCCLs may be divided, in light of the circuit configuration requirements of the products (e.g., printed circuit boards), into single-sided and double-sided FCCLs. Single-sided FCCL is the most fundamental FCCL. It has a copper foil layer useful for circuit formulation clad only on one side thereof. Single-sided FCCL has the advantages of easy fabrication process, low cost, and good flexibility. Double-sided FCCL has a copper foil layer clad on both upper and lower sides. Accordingly, circuits may be formed on both sides of the double-sided FCCL, and may electrically connect to each other by a via hole. Therefore, double-sided FCCL can achieve a higher integration, is beneficial to controlling electrical resistance, and is useful for circuit fabrication simultaneously on both sides, so as to save time.

The structure of a general double-sided polyimide FCCL comprises, sequentially, copper foil, a thermoplastic polyimide layer, a polyimide layer, a thermoplastic polyimide layer and copper foil, and may be prepared from bottom to top by coating one layer on another layer. In other words, the existing polyimide FCCL structure can be prepared sequentially by coating a thermoplastic polyimide layer on a copper foil, coating a polyimide layer on the thermoplastic polyimide layer, coating another thermoplastic polyimide layer on the polyimide layer and then laminating it onto another copper foil. Another process is to coat a thermoplastic polyimide layer on the opposing sides of a polyimide layer, form a structure in the order of a thermoplastic polyimide layer, a polyimide layer and a thermoplastic polyimide layer via baking, and then laminate a layer of copper foil onto the opposing sides of the above structure using a hot press machine.

The existing process involves several repetitions of coating and lamination, is complicated and takes a lot of time. Moreover, two thermoplastic polyimide layers are needed in the existing process. A thermoplastic polyimide layer has less dimensional stability and heat resistance, and so it is easy for foam and delamination to occur in the FCCL during a high temperature process, thereby affecting the yield.

A new process has been introduced to the industry. In this process, a double-sided polyimide FCCL is prepared by laminating two single-sided FCCLs, each of which comprises copper foil, a polyimide layer on the copper foil and a thermoplastic polyimide layer on the polyimide layer, in the manner that the thermoplastic polyimide layers on the two single-sided FCCLs face each other. With the new process, there is no need to repeat the coating and lamination steps layer-by-layer as the existing process does. In other words, in the new process, a double-sided polyimide FCCL can be prepared by carrying out the procedure for preparing single-sided FCCLs once to provide the single-sided FCCLs which are coated with a polyimide layer and then laminating two of such single-sided FCCLs to each other. However, since the adhesion between two polyimide layers is worse, a thermoplastic polyimide layer (TPI) is still required. Thermoplastic polyimide has a lower glass transition temperature (Tg), less heat resistance, higher thermal expansion coefficient, greater size change during expansion and contraction, and is prone to cause warpage or delamination of the FCCL.

In addition, single-sided FCCLs are generally used to prepare single-sided flexible printed circuits. However, single-sided FCCLs tend to warp. Therefore, during printing of the single-sided circuit, a photoresist is applied not only to the surface of the copper foil for circuit fabrication, but also to the surface of the polyimide layer, such that structural balance is achieved on two opposite sides of the FCCL, thereby alleviating the occurrence of warpage. The photoresist is removed in a subsequent step. However, this increases the fabrication cost.

SUMMARY

Through continuous research, the inventors have found a novel polyimide resin. The polyimide resin has at least two glass transition temperatures measured by dynamic mechanical analysis (DMA), can be directly applied to a metal substrate and provides proper peeling strength by adjusting the lamination temperature and pressure (i.e., generates adhesion upon hot pressing). The polyimide resin of the present disclosure is especially applicable to prepare a quasi double-sided two-layer metal clad laminate. The resulting quasi double-sided two-layer metal clad laminate can be easily separated into two single-sided flexible circuit boards after the fabrication of flexible printed circuits, and therefore, the present disclosure can effectively eliminate the disadvantages existing in the process for preparing a single-sided flexible circuit board from a single-sided copper clad laminate and avoid warpage. The present disclosure can use the equipment for preparing a double-sided metal foil printed circuit to prepare two single-sided flexible circuit boards at the same time, and therefore, results in the advantages of simplifying the process and saving time and cost. Besides, in addition to the quasi double-sided two-layer metal clad laminate, the present disclosure can also be used to prepare a double-sided two-layer metal clad laminate by adjusting the lamination temperature and pressure.

Given the above, one objective of the present disclosure is to provide a novel polyimide resin having at least two glass transition temperatures measured by dynamic mechanical analysis (DMA).

Another objective of the present disclosure is to provide a polyimide or polyimide layer comprising the above polyimide resin.

To make the objectives, technical features and advantages of the present disclosure clear and comprehensible, detailed description is given below by way of some specific embodiments.

BRIEF DESCRIPTION OF THE DRAWINGS

The invention will be described according to the appended drawings, in which.

DETAILED DESCRIPTION

Figure 1:
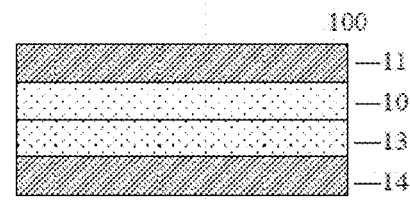
FIG. 1 is a schematic view of a metal clad laminate comprising a polyimide according to the present disclosure.

For ease of understanding the present disclosure, several terms are defined hereinafter.

The term "about" means an acceptable deviation of a particular value determined by those of ordinary skill in the art, the range of which depends on how the value is measured or determined.

In the present disclosure, the term "alkyl" refers to a saturated, straight or branched hydrocarbon group, which comprises preferably 1-14 carbon atoms, and more preferably 1-6 or 1-4 carbon atoms. Examples of alkyl include, but are not limited to, methyl, ethyl, propyl (such as n-propyl and isopropyl), butyl (such as n-butyl, sec-butyl, isobutyl and tert-butyl), pentyl, hexyl, or similar groups.

In the present disclosure, the term "alkenyl" refers to an unsaturated, straight or branched hydrocarbon group containing at least one carbon-carbon double bond, which comprises preferably 2-10 carbon atoms, and more preferably 3-8 carbon atoms. Examples include, but are not limited to, ethenyl, propenyl, methyl propenyl, isopropenyl, pentenyl, hexenyl, heptenyl, 1-propenyl, 2-butenyl, 2-methyl-2-butenyl and similar groups.

In the present disclosure, the term "aryl" or "aromatic" refers to a monocyclic, bicyclic or tricyclic aromatic ring system having 6 to 14 ring carbon atoms. Examples of aryl include, but are not limited to, phenyl, tolyl, naphthyl, fluorenyl, anthryl, phenanthrenyl and similar groups.

In the present disclosure, the term "halogenated alkyl" refers to an alkyl substituted with a halogen, wherein the "halogen" denotes fluorine, chlorine, bromine or iodine.

In the present disclosure, the term "alkoxy" refers to an alkyl attached to an oxygen atom, which comprises preferably 1-8 carbon atoms, and more preferably 1-4 carbon atoms.

In the present disclosure, the term "adhesion upon hot pressing" refers to the adhesion between one polyimide resin layer and another polyimide resin layer that is generated by applying proper heat and pressure.

The polyimide resin has at least two glass transition temperatures measured by dynamic mechanical analysis (DMA). The inventors through extensive research found that when the composition of an polyimide resin is modified such that it has at least two glass transition temperatures, the resulting polyimide resin have adhesion to another polyimide resin layer (especially another polyimide resin layer according to the present disclosure) upon hot pressing. The adhesion can be referred to as "adhesion upon hot pressing" of the polyimide resin.

According to an embodiment of the present disclosure, the polyimide resin comprises a first polyimide and a second polyimide. The first polyimide and the second polyimide may be presented in the polyimide resin as a blend, a block copolymer or any other suitable form, to provide two different glass transition temperatures to the polyimide resin. The first polyimide may be in an amount of about 5 mol % to about 50 mole % (for example, 10 mol %, 15 mol %, 20 mol %, 25 mol %, 30 mol %, 35 mol % or 40 mol %), preferably from about 10 mol % to about 45 mol %, and more preferably from about 15 mol % to about 40 mol %, based on the total of the polyimide resin components. When the amount of the first polyimide is too high (for example, higher than about 50 mol %), then the glass transition temperature of the resulting polyimide layer would be too low, the mechanical strength (for example, tensile strength), the dimensional stability, the thermal resistance and the flame retardance would be poor, and the coefficient of thermal expansion of the polyimide layer would be too large, such that the prepared laminate is prone to warpage. When the amount of the first polyimide is too low (for example, lower than 5 mol %), adhesion upon hot pressing cannot be generated between the polyimide layers.

The first glass transition temperature of the polyimide resin of the present disclosure comes from the first polyimide and is in the range of about 270° C. to about 315° C. (for example, 270° C., 275° C., 280° C., 285° C., 290° C., 295° C., 300° C., 305° C., 310° C. or 315° C.), preferably in the range of about 280° C. to about 310° C., and more preferably in the range of about 285° C. to 305° C.

The first polyimide of the present disclosure is made by the polymerization of a diamine monomer and a dianhydride monomer. The diamine monomer comprises a long-chain diamine monomer and an aromatic diamine monomer. Hence, the first polyimide comprises a polymerization unit derived from a long-chain diamine monomer and an aromatic diamine monomer.

The long-chain diamine monomer used in the present disclosure refers to a diamine monomer which has at least four adjacent atoms and no aromatic group in the main chain.

According to one embodiment, the long-chain diamine monomer used in the present disclosure comprises:

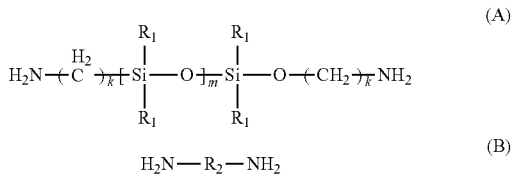

or a combination thereof, wherein each $R_1$ is independently H, $C_1$-$C_4$alkyl, or phenyl; k may be the same or different and is an integer greater than 0, for example, 1, 2, 3, 4 or 5, preferably an integer between 2 to 5; m is an integer greater than 0, for example, 1, 2, 3, 4 or 5, preferably an integer between 1 to 5; and $R_2$ is $C_2$-$C_{14}$alkylene, and preferably $C_3$-$C_8$alkylene, for example, propylene, butylene, pentylene, hexylene, heptylene, octylene or nonamethylene.

The long-chain diamine monomer preferably comprises:

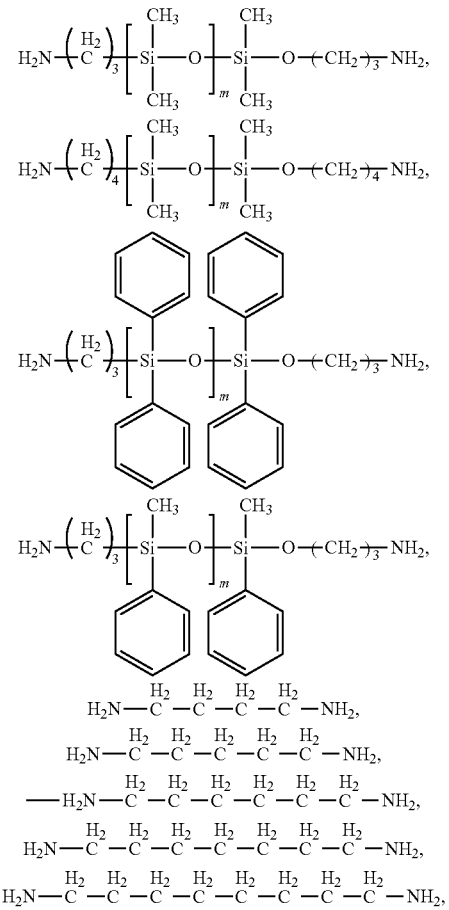

or a combination thereof, wherein m is an integer between 1 to 5.

The long-chain diamine monomer is more preferably

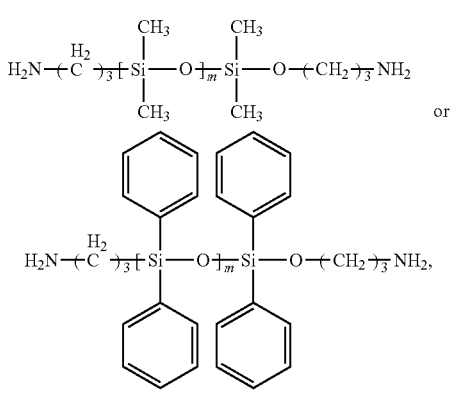

wherein m is an integer between 1 to 5, or

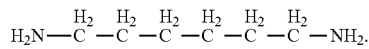

The amount of the long-chain diamine monomer, based on the total moles of the diamine monomers contained in the first polyimide, is from about 5 mol % to about 40 mol %, preferably from about 10 mol % to about 35 mol %, more preferably from about 15 mol % to 30 mol %.

The aromatic diamine monomer used in the present disclosure comprises:

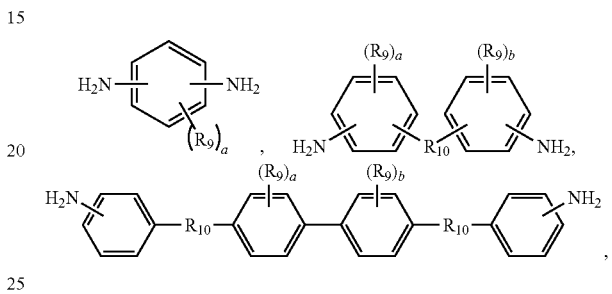

or a combination thereof,
wherein:
each $R_9$ is independently H, $C_1$-$C_4$alkyl, $C_1$-$C_4$perfluoroalkyl, $C_1$-$C_4$alkoxyl or halogen;
each a is independently an integer from 0 to 4;
each b is independently an integer from 0 to 4;
$R_{10}$ is a covalent bond, or selected from the following groups: —O—, —S—, —CH$_2$—, —S(O)$_2$—,

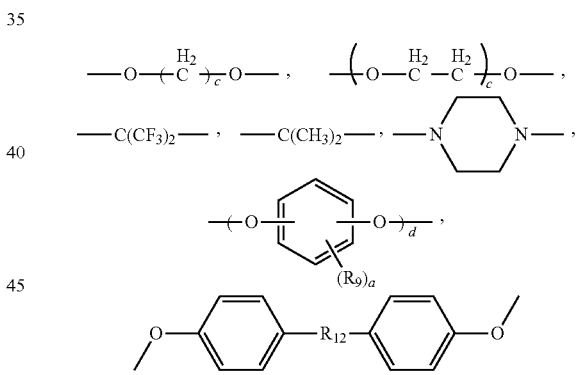

and a combination thereof, wherein c and d are each independently an integer from 1 to 20, $R_{12}$ is —S(O)$_2$—, a covalent bond, $C_1$-$C_4$alkylene or $C_1$-$C_4$ perfluoroalkylene.

The aromatic diamine monomer preferably comprises:

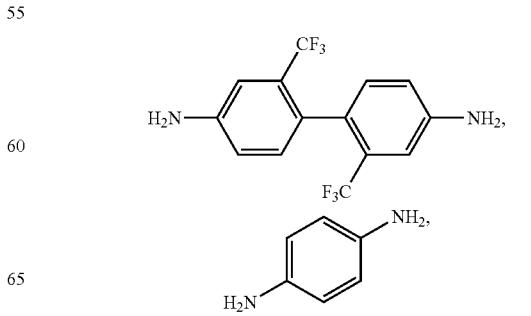

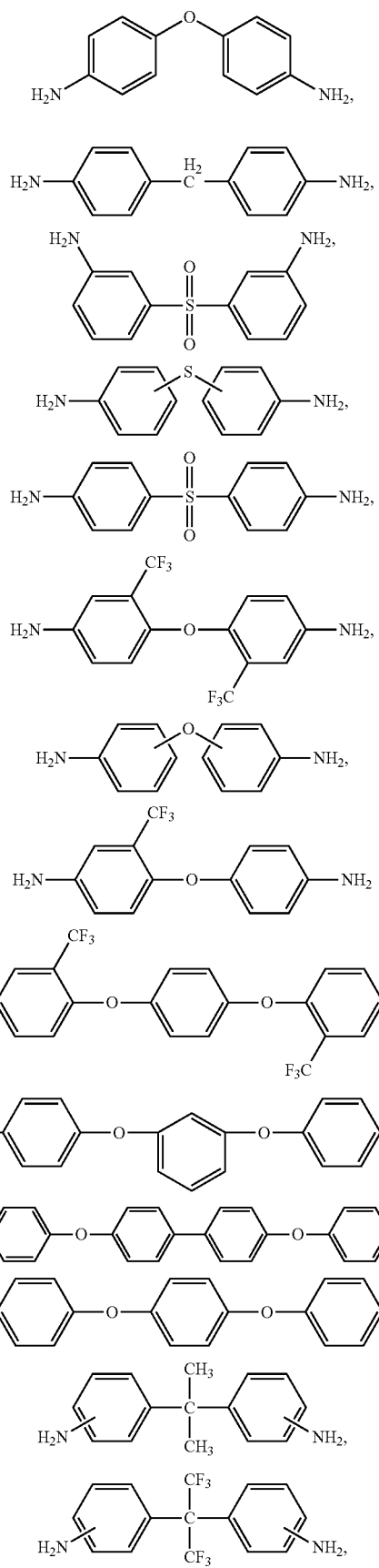
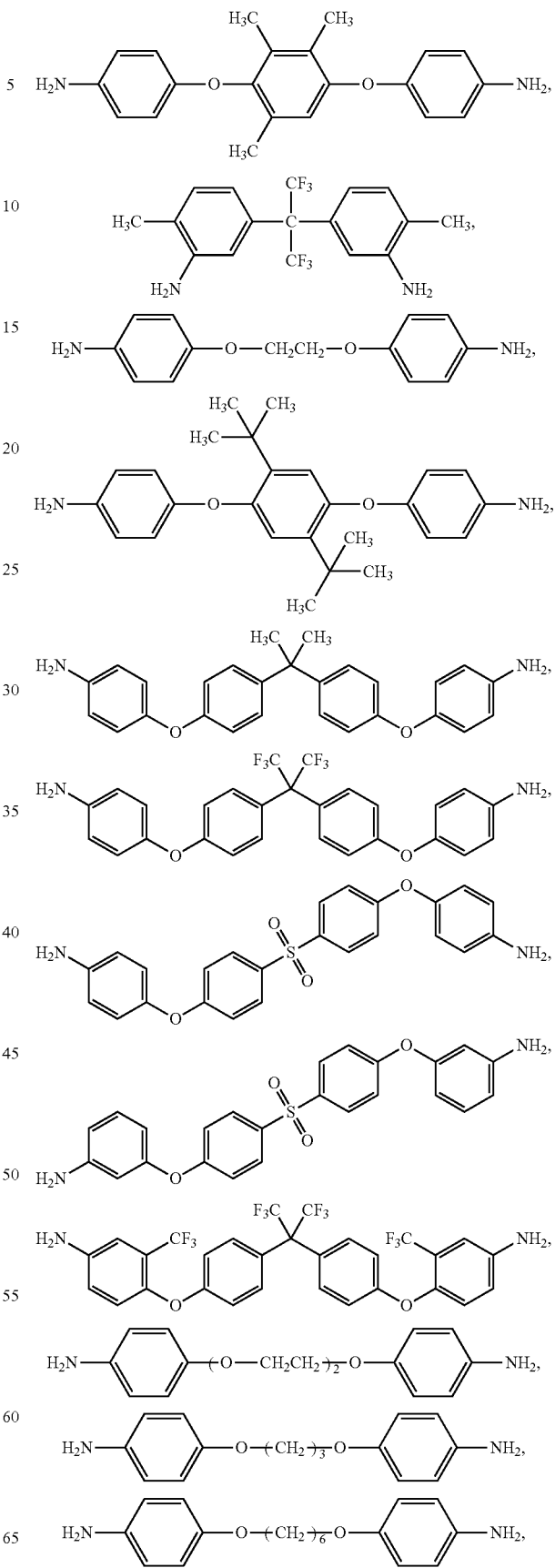

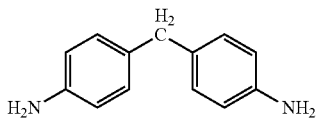

or a combination thereof.

The aromatic diamine monomer more preferably comprises:

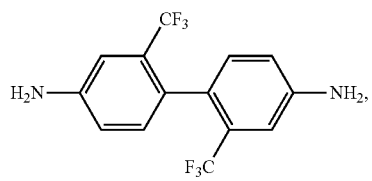

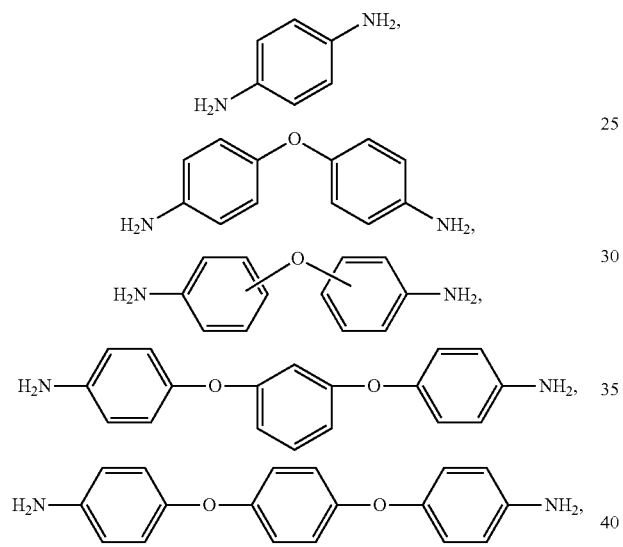

or a combination thereof.

The second glass transition temperature of the polyimide resin of the present disclosure comes from the second polyimide and is in the range of about 350° C. to about 450° C. (for example, 350° C., 360° C., 370° C., 380° C., 390° C., 400° C., 410° C., 420° C., 430° C., 440° C. or 450° C.), and preferably in the range of about 370° C. to about 445° C.

The second polyimide of the present disclosure is made by the polymerization of a diamine monomer and a dianhydride monomer. The diamine monomer comprises a rigid diamine monomer. Hence, the second polyimide comprises a polymerization unit derived from a rigid diamine monomer.

The rigid diamine monomer used in the present disclosure comprises:

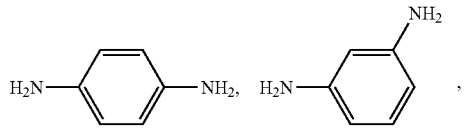

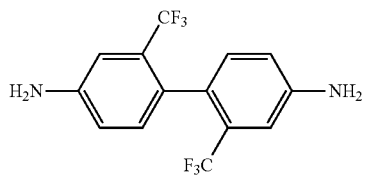

or a combination thereof, wherein the rigid diamine monomer does not comprises a polymerization unit derived from a long-chain diamine monomer.

Under the objective of the present disclosure, the dianhydride monomer for forming the first or second polyimide is not particularly limited. According to one embodiment of the present disclosure, the useful dianhydride monomer is selected from:

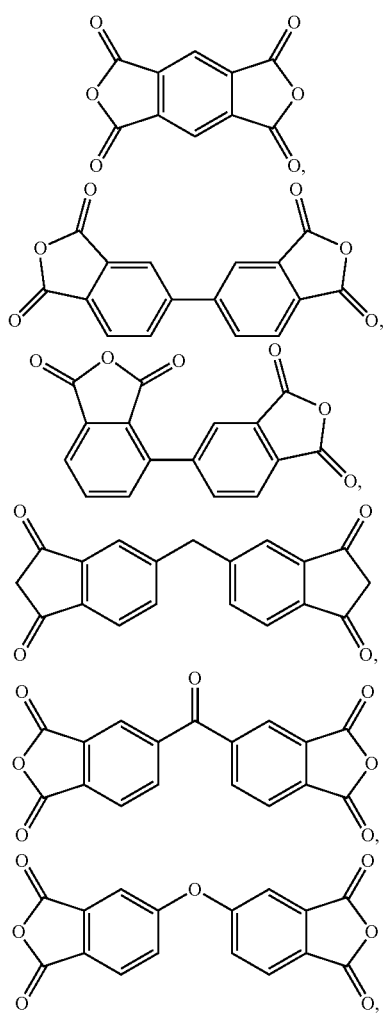

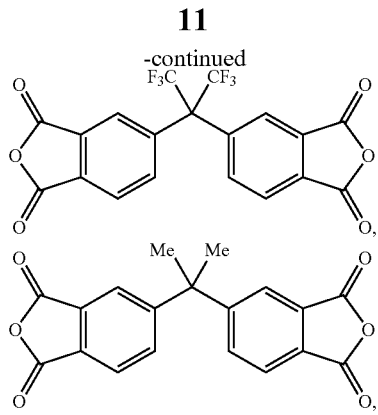

or a combination thereof.

According to one embodiment of the present disclosure, the first polyimide or the second polyimide or the both is not crosslinkable, such that the resulting polymeric layer has better flexural endurance.

The method for preparing the polyimide resin of the present disclosure is not particularly limited as long as a polyimide having at least two glass transition temperatures as required can be prepared. In general, a formulation containing two or more kinds of different polyimide precursors can be prepared by adjusting the composition and proportions of the polymers, and then a polyimide resin can be prepared by cyclizing and polymerizing the polyimide precursors. The resulting polyimide resin contains two or more kinds of different polyimides (e.g., a first polyimide and a second polyimide) and can provide two or more different glass transition temperatures.

In the present disclosure, the difference between the first polyimide and the second polyimide lies in their composition, not the preparation method. In one embodiment, the precursor for the first polyimide may be prepared first, followed by adding the dianhydride monomer and the rigid diamine monomer to prepare the precursor for the second polyimide. In another embodiment, the precursor for the second polyimide may be prepared first, followed by adding the dianhydride monomer, the long-chain diamine monomer and the aromatic diamine monomer to prepare the precursor for the first polyimide.

The precursor for the first polyimide and the precursor for the second polyimide can be prepared using any method known to a person of ordinary skill in the art.

According to one embodiment of the present disclosure, the precursors for the first polyimide/the second polyimide can be prepared by the following steps:

(a) reacting a dianhydride of formula (1) with a compound having hydroxyl (R—OH) to form a compound of formula (2);

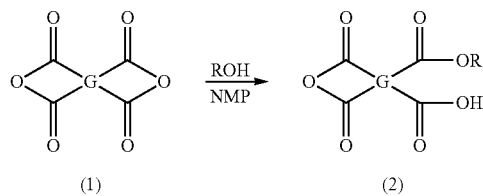

(b) adding a diamine compound of formula H$_2$N—P—NH$_2$ to the product of step (a) to form an amic acid ester oligomer of formula (3) (i.e., a precursor for polyimide); and

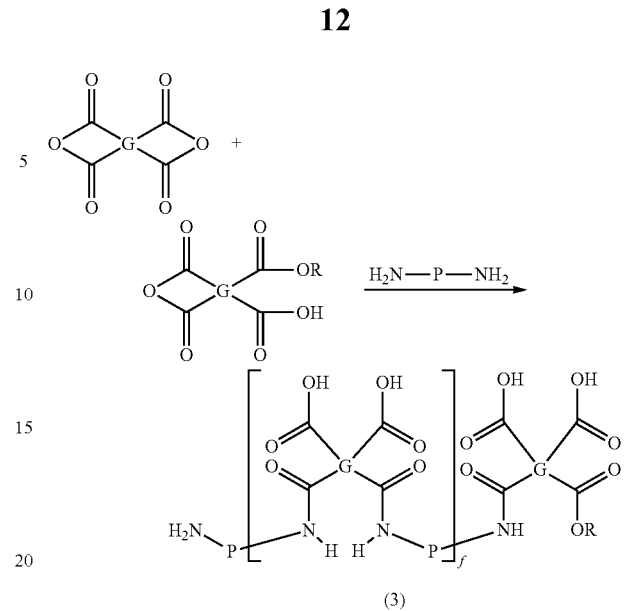

(c) optionally adding one or more monomers having a photo-sensitive group (R*), such as epoxy acrylate, for carrying out reaction to form an amic acid ester oligomer of formula (4)

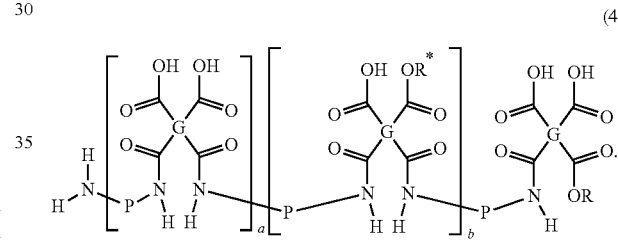

According to another embodiment of the present disclosure, the precursors for the first polyimide/the second polyimide can be prepared by the following steps:

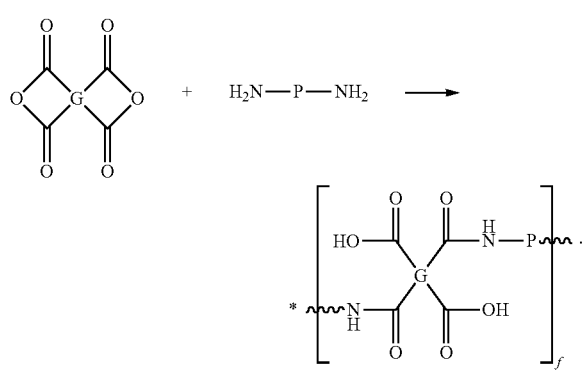

The above G and P are a corresponding tetravalent organic group of the dianhydride monomer and a corresponding divalent organic group of the diamine monomer, respectively. f, a and b are the number of the corresponding repeating units.

Suitable additives, such as a metal adhesion promoter, a cyclization promoter, a leveling agent, a defoaming agent, a coupling agent, a dehydrating agent, a catalyst, etc. can be optionally added to the method for preparing a polyimide precursor formulation according to the present disclosure.

According to one embodiment of the present disclosure, a metal adhesion promoter can be optionally added to the method for preparing a polyimide precursor formulation according to the present disclosure. The metal adhesion promoter (such as copper adhesion promotor) can form a complex with metal foil (e.g., copper foil), thereby enhancing the adhesion between metal foil and polyimide resin layer.

The metal adhesion promoter can be N-containing heterocycles, for example, 5 to 6-membered heterocycles containing 1 to 3 nitrogen atoms, such as imidazoles, pyridines or triazoles; or fused ring compounds containing any of the above-mentioned N-containing heterocycle in structure. The above N-containing heterocycles can be unsubstituted or substituted by one to three substituent group. The substituent group can be, for example, but is not limited to hydroxyl or 5 to 6-membered heterocyclyl containing 1 to 3 nitrogen atoms. According to the present disclosure, the metal adhesion promoter, if present, is in an amount of about 0.1 parts by weight to about 2 parts by weight, preferably in an amount of about 0.2 parts by weight to about 1.5 parts by weight, based on 100 parts by weight of the total weight of the resin components in the polyimide precursor formulation.

Examples of the metal adhesion promoter include, but are not limited: 1,2,3-triazole, 1,2,4-triazole, 3-amino-1,2,4-triazole, 3,5-diamino-1,2,4-triazole, imidazole, benzimidazole, 1,2,3,4-tetrahydrocarbazole, 2-hydroxybenzimidazole, 2-(2-hydroxyphenyl)-1H-benzimidazole, 2-(2-pyridyl)-benzimidazole, 2-(3-pyridyl)-1H-benzimidazole or a combination thereof.

According to one embodiment of the present disclosure, a cyclization promoter can be optionally added to the method for preparing a polyimide precursor formulation according to the present disclosure.

Preferably, a cyclization promoter which generates a base upon heating can be used to provide a base environment for facilitating the imidization reaction. According to the present disclosure, the cyclization promoter, if present, is in an amount of about 0.1 parts by weight to about 5 parts by weight, and preferably in an amount of about 0.5 parts by weight to about 2 parts by weight, based on 100 parts by weight of the total weight of the resin components in the polyimide precursor formulation.

The cyclization promoter preferably has the following formula:

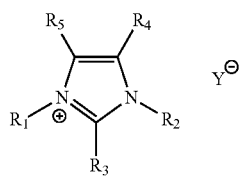

(C)

wherein $R_1$ and $R_2$ are the same or different and are each independently H, $C_1$-$C_6$alkyl, $C_1$-$C_6$haloalkyl, or $C_1$-$C_6$alkyl substituted with one or more $C_6$-$C_{14}$aryl,

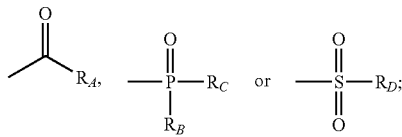

$R_A$ is $C_1$-$C_6$alkyl, $C_1$-$C_6$haloalkyl, $C_1$-$C_8$alkoxy unsubstituted or substituted with one or more $C_6$-$C_{14}$aryl, or —$NR_ER_F$; $R_B$, $R_C$, $R_D$, $R_E$ and $R_F$ are the same or different, and are each independently H, $C_1$-$C_{14}$alkyl unsubstituted or substituted with one or more $C_6$-$C_{14}$aryl, or $C_6$-$C_{14}$ aryl; $R_3$, $R_4$ and $R_5$ are the same or different, and are each independently H, $C_1$-$C_6$alkyl unsubstituted or substituted with one or more $C_6$-$C_{14}$aryl, $C_1$-$C_6$ hydroxyalkyl, $C_1$-$C_6$cyanoalkyl, or $C_6$-$C_{14}$aryl; $Y^\ominus$ is an anionic group.

According to an embodiment of the present disclosure, the groups $R_1$ and $R_2$ in formula (C) are the same or different and are each independently $C_1$-$C_6$alkyl,

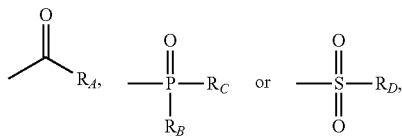

wherein $R_A$ is $C_1$-$C_6$alkyl, $C_1$-$C_6$haloalkyl, $C_1$-$C_8$alkoxy unsubstituted or substituted with one or more $C_6$-$C_{14}$aryl, or —$NR_ER_F$; and $R_B$, $R_C$, $R_D$, $R_E$ and $R_F$ are the same or different and are each independent H, $C_1$-$C_{14}$alkyl, or $C_6$-$C_{14}$aryl. Preferably, $R_A$ is methyl, ethyl, n-propyl, isopropyl, n-butyl, isobutyl, tert-butyl, pentyl, hexyl, trifluoromethyl, pentafluoethyl, methoxy, ethoxy, propoxy, butoxy, pentyloxy, hexyloxy, benzyloxy and fluorenylmethoxy; and $R_B$, $R_C$, $R_D$, $R_E$ and $R_F$ are each independently H, methyl, ethyl, n-propyl, isopropyl, n-butyl, isobutyl, tert-butyl, pentyl, hexyl, heptyl, octyl, phenyl, benzyl or diphenyl methyl.

According to one embodiment of the present disclosure, the groups $R_1$ and $R_2$ in formula (C) are the same or different and are each independently methyl, ethyl, propyl, butyl or selected from a group consisting of:

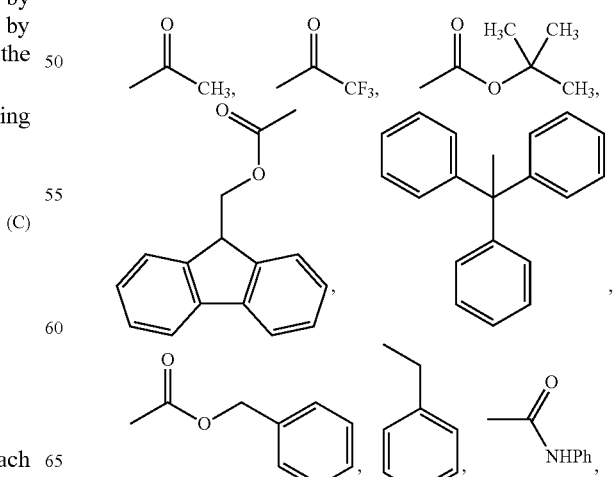

-continued

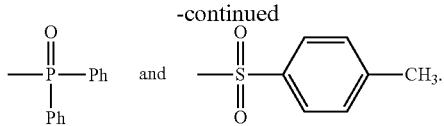

Preferably, $R_1$ and $R_2$ are the same or different and are each independently methyl, ethyl or selected from a group consisting of:

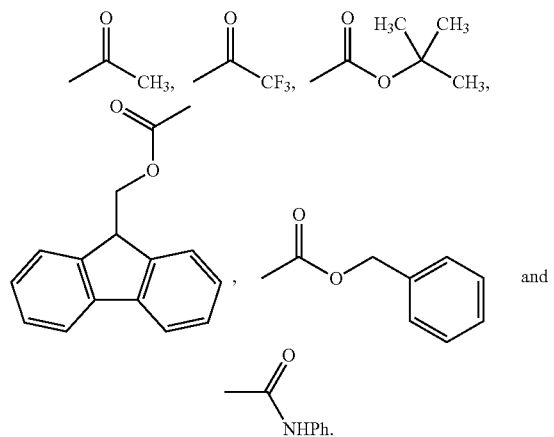

According to one embodiment of the present disclosure, $R_3$, $R_4$ and $R_5$ in formula (C) are the same or different and are each independently H, methyl, ethyl, n-propyl, isopropyl, n-butyl, isobutyl, tert-butyl, pentyl, hexyl, hydroxymethyl, hydroxyethyl, hydroxypropyl, hydroxybutyl, hydroxypentyl, hydroxyhexyl, cyanomethyl, cyanoethyl, cyanopropyl, cyanobutyl, cyanopentyl, cyanohexyl, phenyl, benzyl or diphenylmethyl. Hydroxybutyl is preferably

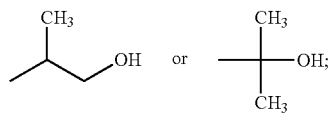

hydroxypentyl is preferably

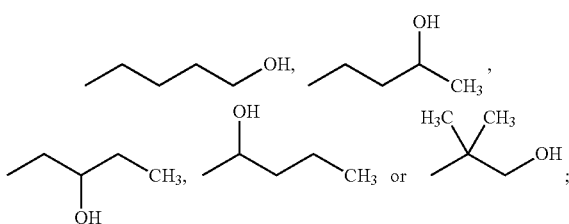

cyanobutyl is preferably

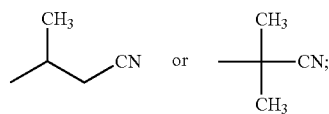

cyanopentyl is preferably

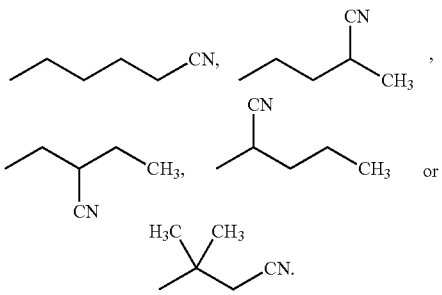

Preferably, $R_3$, $R_4$ and $R_5$ are the same or different and are each independently H, methyl, ethyl, n-propyl or isopropyl.

The anionic group in formula (C) is not particularly limited, examples thereof including, but not limited to, halide ion, sulfate, nitrate, phosphate, sulfonate, carbonate, tetrafluoroborate, borate, chlorate, iodate, hexafluorophosphate, perchlorate, trifluoromethanesulfonate, trifluoroacetate, acetate, tert-butylcarbonate, $(CF_3SO_2)_2N^-$ or tert-butyloxy. According to one embodiment of the present disclosure, the anionic group in formula (C) is halide ion or tetrafluoborate. Preferably, the halide ion is fluoride ion and chloride ion.

In addition, a solvent can be optionally added during or after the preparation of a polyimide precursor formulation according to the present disclosure. The amount of solvent is not particularly limited and can be used to make it easy to apply the composition.

The solvent used in the present disclosure may comprise or be selected from the following groups: dimethyl sulfoxide (DMSO), diethyl sulfoxide, N,N-dimethyl-methanamide (DMF), N,N-diethyl-methanamide, N,N-dimethylacetamide (DMAc), N,N-diethylacetamide, N-methyl-2-pyrrolidone (NMP), N-ethyl-2-pyrrolidone (NEP), phenol, o-cresol, m-cresol, p-cresol, xylenol, halogenated phenol, pyrocatechol, tetrahydrofuran (THF), dioxane, dioxolane, propylene glycol monomethyl ether (PGME), tetraethylene glycol dimethyl ether (TGDE), methanol, ethanol, butanol, 2-butoxyethanol, γ-butyrolactone (GBL), xylene, toluene, hexamethylphosphoramide, propylene glycol monomethyl ether acetate (PGMEA) and a mixture thereof. The solvent is preferably a polar aprotic solvent, for example, a solvent selected from the following groups: dimethyl sulfoxide (DMSO), diethyl sulfoxide, N,N-dimethyl-methanamide (DMF), N,N-diethyl-methanamide, N,N-dimethylacetamide (DMAc), N,N-diethylacetamide, N-methyl-2-pyrrolidone (NMP), N-ethyl-2-pyrrolidone (NEP), γ-butyrolactone (GBL).

The polyimide precursor formulation according to the present disclosure can be applied to a substrate, for example, a copper clad laminate, and then cyclized and polymerized into a polyimide resin. According to an embodiment of the present disclosure, the polyimide precursor formulation is applied onto a metal foil (to a thickness of, for example, but not limited thereto, about 2 to 180 µm), pre-heated to remove the solvent (for example, but not limited to, at 50 to 200° C. for 1 to 20 min), and then further heated, to allow the amic acid ester oligomer to dehydrate and cyclize into a polyimide (for example, but not limited to, at 250 to 350° C. for 30 to 180 min).

The polyimide resin of the present disclosure has excellent physical properties, mechanical properties and low thermal expansion coefficient, and is useful as a polyimide layer in a metal clad laminate.

The present disclosure further provides a method for preparing a metal clad laminate using the polyimide resin and provides a metal clad laminate comprising the polyimide resin, wherein the polyimide resin is used as a polyimide layer of the metal clad laminate.

According to one embodiment of the present disclosure, the metal clad laminate of the present disclosure comprises: a first metal foil; a first polyimide layer directly disposed on the first metal foil; a second metal foil; and a second polyimide layer directly disposed on the second metal foil, wherein the first polyimide layer is in contact with the second polyimide layer and the first polyimide layer and/or the second polyimide layer comprises the polyimide resin.

FIG. 1 is a schematic view of a metal clad laminate using the polyimide resin according to the present disclosure. As shown in FIG. 1, the metal clad laminate 100 comprises a first metal foil 11; a first polyimide layer 10 directly disposed on the first metal foil 11; a second metal foil 14; and a second polyimide layer 13 directly disposed on the second metal foil 14. The first polyimide layer and the first metal foil, and the second polyimide layer and the second metal foil have a close or substantially the same coefficient of thermal expansion. At least one of the first polyimide layer 10 and the second polyimide layer 13 (preferably both) is made of the polyimide resin according to the present disclosure.

According to the present disclosure, the first metal foil and the second metal foil are each a metal or alloy having a coefficient of thermal expansion ranging from about 15 to about 30 ppm/° C. (preferably, about 15 to about 25 ppm/° C.), for example, but not limited to: aluminum, copper, silver, an alloy containing any combination of aluminum, copper, and silver, or other alloys having a coefficient of thermal expansion ranging from about 15 to about 30 ppm/° C. According to a preferred embodiment of the present disclosure, the first metal foil and the second metal foil are a copper foil, an aluminum foil or a copper-aluminum alloy foil. The copper foil refers to a foil composed of copper or having copper as the main component (for example, a foil with a copper content of 90 wt % or more), and may be selected from the group consisting of rolled annealed copper foil (Ra copper foil), electrodeposited copper foil (ED copper foil) and a combination thereof. The aluminum foil refers to a foil made of aluminum or having aluminum as the main component (for example, a foil with an aluminum content of 90 wt % or more). The definitions of other metal foils may be deduced by analogy.

The thickness of the first metal foil and the second metal foil is not particularly limited, and generally ranges from about 0.05 to about 50 µm, preferably from about 0.1 to about 35 µm, and more preferably from about 5 to about 20 µm.

Since at least one of the first polyimide layer 10 and the second polyimide layer 13 (preferably both) is made of the polyimide resin according to the present disclosure, due to the "adhesion upon hot pressing" of the polyimide resin according to the present disclosure, adhesion between the first polyimide layer 10 and the second polyimide layer 13 can be generated when heat and pressure is applied. Therefore, a thermoplastic polyimide (TPI) resin required in conventional metal clad laminates can be omitted. Accordingly, the method for preparing the metal clad laminate can be simplified, and the obtained metal clad laminate has good heat resistance, is applicable to a high-temperature manufacturing process, and is beneficial to the fabrication of semi-conductor components.

In the present disclosure, the thickness of the polyimide layer is not particularly limited, and may be adjusted, depending on the nature of the raw material and the desired property of the product. According to an embodiment of the present disclosure, the thickness of the first polyimide layer and the second polyimide layer may each range from about 1 to about 90 µm, preferably from about 3 to about 50 µm, and more preferably from about 5 to about 30 µm.

In a preferred specific embodiment of the present disclosure, the first polyimide layer and the first metal foil, and the second polyimide layer and the second metal foil have a close or substantially the same coefficient of thermal expansion. Preferably, the first polyimide layer and the second polyimide layer each have a coefficient of thermal expansion ranging from 15 to 30 ppm/° C. (preferably, 15 to 25 ppm/° C.). The coefficient of thermal expansion of the first polyimide layer and the second polyimide layer may be adjusted, depending on the species of metal foil. The coefficient of thermal expansion of the first polyimide layer and the second polyimide layer may be adjusted to approach the coefficient of thermal expansion of the first metal foil and the second metal foil. For example, when the metal foil is a copper foil, the first polyimide layer and the second polyimide layer preferably each have a coefficient of thermal expansion ranging from 15 to 19 ppm/° C. Because the first polyimide layer and the second polyimide layer have a coefficient of thermal expansion close to that of the first metal foil and that of the second metal foil, warpage is reduced, thus increasing flatness of the metal clad laminate.

The metal clad laminate of the present disclosure is equivalent to a double-sided flexible metal foil (e.g. copper foil) laminate in structure, is superior to a single-sided flexible copper foil laminate in terms of mechanical properties, and can be used for circuit fabrication simultaneously on both sides. In contrast to the existing double-sided flexible copper foil laminate, in the present disclosure, the peeling strength between the first polyimide layer and the second polyimide layer can be controlled by adjusting the lamination temperature and/or pressure during preparation of the metal clad laminate, to prepare a quasi double-sided two-layer metal clad laminate or a double-sided two-layer metal clad laminate.

In a preferred embodiment of the present disclosure, the metal clad laminate is a quasi double-sided two-layer metal clad laminate. The peeling strength between the first polyimide layer and the second polyimide layer in the quasi double-sided two-layer metal clad laminate ranges from 3 to 100 gf/cm, and preferably from about 4 to about 50 gf/cm. More preferably, the peeling strength between the first polyimide layer and the second polyimide layer ranges from about 5 to about 30 gf/cm, to avoid the tendency for warpage upon separation due to the high adhesion between the first polyimide layer and the second polyimide layer. In this embodiment, the quasi double-sided two-layer metal clad laminate can be used for circuit fabrication on both sides of the metal clad laminate, to prepare two separate flexible printed circuit boards. The first polyimide layer and the second polyimide layer have a suitable peeling strength at the interface therebetween, and accordingly may be separated from each other at the interface after the fabrication of the component is complete, to obtain two single-sided flexible printed circuit boards at the same time. The flexible printed circuit board prepared with the metal clad laminate having the polyimide of the present disclosure has a structure equivalent to that of the flexible printed circuit board prepared with a single-sided FCCL, is light and thin and has good flexibility. However, compared with the process using single-sided FCCL, two flexible printed circuit boards can be prepared at the same time in a single process by using the quasi double-sided two-layer metal clad laminate according to the present disclosure. As such, productivity can be raised and process time can be reduced. In addition, the common single-sided FCCLs tend to warp. Therefore, during printing of a circuit, a photoresist is applied not only to the surface of the copper foil for circuit fabrication, but also to the surface of the polyimide layer, such that structural balance is achieved on two opposite sides of the FCCL, thereby alleviating the occurrence of warpage. The photoresist is removed in a subsequent step. However, this increases the fabrication cost. The quasi double-sided two-layer metal clad laminate having the polyimide of the present disclosure has a symmetric structure per se and can be used for circuit fabrication simultaneously on both sides. Therefore, compared with a common single-sided FCCL, the metal clad laminate having the polyimide of the present disclosure is not prone to warp, and can be used in an expeditious and economical manner to fabricate a flexible printed circuit board.

In another specific embodiment of the present disclosure, the peeling strength between the first polyimide layer and the second polyimide layer in the double-sided two-layer metal clad laminate is greater than 100 gf/cm, preferably greater than 200 gf/cm, and more preferably greater than 300 gf/cm. In this embodiment, the peeling strength is substantial and the adhesion is good at the interface between the first polyimide layer and the second polyimide layer. Therefore, the double-sided metal clad laminate is useful in the fabrication of a double-side wired flexible printed circuit board.

The present disclosure further provides a method for preparing the metal clad laminate. The method according to the present disclosure comprises:

(a) providing a first metal film comprising a first metal foil and a first polyimide layer directly disposed on the first metal foil;

(b) providing a second metal film comprising a second metal foil and a second polyimide layer directly disposed on the second metal foil; and (c) laminating the first polyimide layer of the first metal film to the second polyimide layer of the second metal film, wherein the first metal foil and the second metal foil each have a coefficient of thermal expansion ranging from 15 to 30 ppm/° C.

The materials and properties of the first metal foil, the second metal foil, the first polyimide layer and the second polyimide layer are as described herein above.

In steps (a) and (b), the first metal film and the second metal film are each a flexible metal film without adhesive. The method for preparing the first metal film and the second metal film is not particularly limited, and may be for example sputtering/plating, casting or hot lamination. For example: 1. in the sputtering/plating process, a layer of metal film (approximately below 1 μm) is deposited by sputtering onto a polyimide film prepared by the polyimide resin of the present disclosure in high vacuum environment, the surface is roughened by lithographic etching, and then the metal layer is increased to a desired thickness by electroplating. 2. In the casting process, the polyimide precursor formulation of the present disclosure is applied onto a metal foil which is used as a carrier, and then a flexible metal film is formed after high-temperature cyclization. 3. In the hot lamination process, a polyimide film prepared by the polyimide resin of the present disclosure is used as a carrier and coated with a layer of a thermoplastic polyimide, a metal foil is disposed on the thermoplastic polyimide, and the thermoplastic polyimide is melted again and laminated to the metal foil under a nitrogen atmosphere by high-temperature heated rollers under appropriate lamination pressure, to form a flexible metal film. The casting process is preferred.

According to another embodiment of the present disclosure, a glass or plastic may be used as a carrier, and a polyimide precursor formulation may be coated onto the carrier, to form a semi-finished product comprising the carrier and a resin layer. The semi-finished product is dried by heating to remove the solvent, thus forming a product comprising the carrier and the resin layer. A metal foil layer is formed on the surface of the resin layer of the product by sputtering/plating or hot lamination as described above, and then a flexible metal film is prepared by carrying out a further heat treatment after the removal of the glass or plastic carrier. The plastic carrier is preferably polyethylene terephthalate, polymethyl methyacrylate, polycyclic olefins, cellulose triacetate or a mixture thereof.

In step (c), no adhesive exists between the first polyimide layer and the second polyimide layer. Step (c) can be carried out by any method, preferably by a roll-to-roll method in which the first polyimide layer of the first metal film faces the second polyimide layer of the second metal film and then is laminated thereon. In step (c), the lamination may be carried out in any way, for example, but not limited thereto, roller lamination, hot press, vacuum lamination, or vacuum press, and preferably roller lamination. If necessary, a protective film may be applied to and laminated together with the metal film (as protective film/first metal film or second metal film/protective film). The type of protective film is not particularly limited; for example, NPI available from KANEKA Corporation may be used as a protective film.

At least one of the polyimide layers used in the process comprising step (c) is prepared by the polyimide resin of the present disclosure such that adhesion generates after the lamination of the first polyimide layer and the second polyimide layer. For example, the first polyimide layer may be superposed onto the second polyimide layer, and then laminated in a roller press at an elevated temperature under an elevated pressure such that the adhesion strength can be increased. The temperature and pressure described above depend on the desired peeling strength between the first polyimide layer and the second polyimide layer. In addition, since the polyimide resin of the present disclosure has a coefficient of thermal expansion close to that of the metal foil, and thus warpage can be avoided.

The lamination in step (c) is preferably carried out at a temperature greater than the first glass transition temperature. The lamination temperature and pressure may be adjusted depending on the product to be produced. It is found by the present inventors through repeated experiments and research that the quasi double-sided two-layer metal clad laminate or double-sided two-layer metal clad laminate may be prepared by taking into consideration the lamination temperature and pressure in combination with the glass transition temperatures of the first polyimide layer and the second polyimide layer.

According to a specific embodiment of the present disclosure, the first glass transition temperature is in the range of 270 to 315° C., the lamination temperature is controlled to 310 to 390° C., the lamination line pressure is controlled to 1 to 60 kgf/cm, and the resulting metal clad laminate is a quasi double-sided two-layer metal clad laminate. According to a preferred embodiment of the present disclosure, the first polyimide layer and the second polyimide layer are laminated by roller lamination using a roller press at a lamination temperature that is preferably in the range of 320 to 380° C., and under a lamination line pressure that is preferably in the range of 5 to 50 kgf/cm, to prepare a quasi double-sided two-layer metal clad laminate. The peeling strength at the interface between the first polyimide layer and the second polyimide layer of the quasi double-sided two-layer metal clad laminate is in the range of 3 to 100 gf/cm, for example, 3, 4, 5, 6, 7, 8, 9, 10, 15, 20, 30, 45, 60, 75, 90 or 100 gf/cm, preferably in the range of 4 to 50 gf/cm, and more preferably in the range of 5 to 30 gf/cm. For the quasi double-sided two-layer metal clad laminate formed under the above lamination conditions, appropriate adhesion exists between the first polyimide layer and the second polyimide layer. Therefore, the quasi double-sided two-layer metal clad laminate can be used for fabrication of a flexible circuit board through a relevant process for preparing such. After the flexible circuit board is prepared, two single-sided flexible circuit boards may be easily obtained by separating the first polyimide layer from the second polyimide layer. The above-mentioned line pressure refers to a force for lamination applied by two rollers in a roller heat press machine onto a substrate with a constant width divided by the width of the substrate.

According to another specific embodiment of the present disclosure, the first glass transition temperature is in the range of 270 to 315° C. By adjusting the lamination temperature and pressure, a double-sided two-layer metal clad laminate can also be prepared in the present disclosure. For example, using a lamination temperature in the range of 350 to 400° C. and a lamination line pressure in the range of 100 to 200 kgf/cm, a peeling strength greater than 100 gf/cm, preferably greater than 200 gf/cm, and more preferably greater than 300 gf/cm, is produced at the interface between the first polyimide layer and the second polyimide layer, and the first polyimide layer and the second polyimide layer can be effectively adhered together without separation from each other.

To prevent warpage during the process for preparing a single-sided flexible circuit board, a dry film photoresist is generally attached to both an upper and a lower surface of the single-sided copper clad laminate. However, this causes the waste of photoresist. In addition, to save time in processing, persons skilled in the art use an adhesive tape to adhere the polyimide layers of two single-sided copper clad laminates together, and separate them after the fabrication of circuits on both sides. However, attachment an adhesive tape is generally applicable only to a sheet by sheet process, and encounters difficulty when applied to a roll to roll process, and therefore, it is unable to continuously and rapidly produce the products by the roll to roll process in this case. Moreover, because such adhesive tapes are mostly epoxy resins or acrylates without high temperature resistance and having poor chemical resistance, and the fabrication of printed circuit boards generally involves acidic electroplating, acidic etching and alkaline development, gold plating, electroless nickel immersion gold (ENIG) and other processes, the adhesive tapes generally need to be removed upon failure (for example, after etching) and a new adhesive tape is required for reattachment such that subsequent processes can be carried out. Such fabrication process is complicated and may result in adhesive residue. Furthermore, during the preparation of a double-sided flexible circuit board in the prior art, due to the poor adhesion (generally, the peeling strength is about <1 gf/cm) between the polyimide layers, a thermoplastic polyimide is commonly used to provide adhesion to the polyimide layers. For example, ROC (Taiwan) Patent Application No. 200709751A discloses bonding of two polyimide layers with a thermoplastic polyimide, which however increases the complexity of the process. Moreover, in general, the glass transition temperature of a thermoplastic polyimide can be lowered by introducing a flexible group (e.g. C=O, —O—, and —S—) to reduce the rigidity of the backbone, a monomer having an asymmetrically structure to reduce the symmetry of the polymer, or a monomer having a non-planar structure to reduce the co-planar structure of the polymer, or by reducing its regularity. Generally, a thermoplastic polyimide has a lower glass transition temperature (Tg) (about 170 to 250° C.) and higher thermal expansion coefficient (about 40 to 90 ppm/° C.), and is prone to cause warpage of the laminate. Moreover, the low glass transition temperature of the thermoplastic polyimide is adverse to the heat resistance of the double-sided laminate.

The polyimide resin has at least two glass transition temperatures measured by dynamic mechanical analysis (DMA) (e.g., a first glass transition temperature in the range of about 270° C. to about 315° C. and a second glass transition temperature in the range of about 350° C. to about 450° C.). The polyimide layer made of the above polyimide resin has adhesion upon hot pressing and a coefficient of thermal expansion close to that of a metal foil (e.g., in the range of 15 to 30 ppm/° C.), and therefore, it is applicable to a metal clad laminate and can reduce warpage and increase flatness. Although a common thermal polyimide may have good adhesion upon hot pressing, the thermal polyimide has the disadvantages such as higher thermal expansion coefficient and poor heat resistance. Therefore, the thermal polyimide cannot be used solely as a material layer of a metal clad laminate, and is only suitable to be used as an adhesive layer. The common polyimides other than thermal polyimides may have a thermal expansion coefficient in the range of 15 to 30 ppm/° C.; however, they do not provide adhesion upon hot pressing and cannot effectively adhere to another polyimide layer. The polyimide resin of the present invention has a first glass transition temperature in the range of about 270° C. to about 315° C. and a second glass transition temperature in the range of about 350° C. to about 450° C. and thus it not only has a proper thermal expansion coefficient and heat resistance (it is believed that such effect results from the second glass transition temperature) but also can generate a proper "adhesion upon hot pressing" by adjusting lamination temperature and pressure (it is believed that such effect results from the first glass transition temperature.

Furthermore, the inventors of the present disclosure found that a quasi double-sided two-layer metal clad laminate may be prepared by using the polyimide layer made by the above polyimide resin and appropriately adjusting the lamination temperature and pressure, and can be easily separated into two single-sided flexible circuit boards after the fabrication of circuit on both sides of the quasi double-sided two-layer metal clad laminate. This eliminates the disadvantage currently existing in the industry that a dry film photoresist is required to be attached to both an upper and a lower surface of a single-sided copper clad laminate or an adhesive tape is required to be used in the preparation of a single-sided flexible circuit board, and thus results in the advantages of a simplified process and reduced cost. In addition, the quasi double-sided two-layer metal clad laminate is more applicable to a roll to roll process. Also, after a polyimide layer is prepared using the above polyimide resin of the present disclosure, a double-sided two-layer metal clad laminate may be prepared by appropriately adjusting the lamination temperature and pressure so that the disadvantage existing in the industry of use of a thermoplastic polyimide in the preparation of a double-sided metal clad laminate can be eliminated. This lowers production costs while simultaneously enhancing the heat resistance of the laminate. The metal clad laminate according to the present disclosure can be used to prepare single-sided or double-sided flexible circuit boards. Since the metal clad laminate according to the present disclosure contains neither adhesive nor a thermal polyimide layer for providing adhesion between metal foil and a polyimide layer, a light and thin flexible circuit board can be prepared. In addition, since the polyimide layer has a coefficient of thermal expansion close to that of a metal foil, warpage can be avoided.

Therefore, the present disclosure further provides a method for preparing a single-sided flexible circuit board by using the quasi double-sided two-layer metal clad laminate, which further comprises the steps of:

(d) forming at least one circuit unit respectively on the surface of the first metal foil and the second metal foil of the metal clad laminate; and (e) separating the first polyimide layer from the second polyimide layer, to form two single-sided flexible circuit boards.

It should be understood by those of skill in the art that the surface of the first metal foil on which the circuit unit is formed in step (d) refers to a surface of the first metal foil opposing the surface of the first metal foil adhered to the first polyimide layer, and the surface of the second metal foil on which the circuit unit is formed refers to a surface of the second metal foil opposing the surface of the second metal foil adhered to the second polyimide layer.

Figure 2:
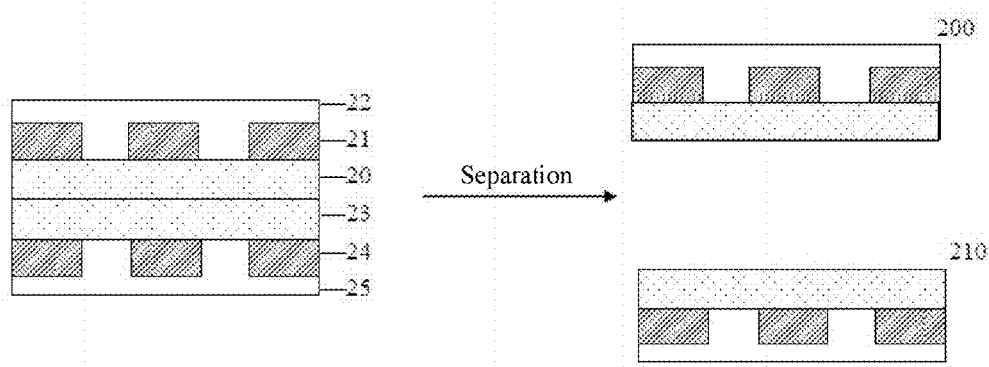
FIG. 2 is a schematic view showing the preparation of two single-side wired flexible circuit boards by using a metal clad laminate comprising a polyimide according to the present disclosure.

The method for forming the circuit unit in step (d) is not particularly limited, and may be any suitable method known to those skilled in the art. For example, as shown in FIG. 2 (which is a schematic view showing the preparation of two single-side wired flexible circuit boards by using the metal clad laminate according to the present disclosure), each of the first metal foil 21 on the first polyimide layer 20 and the second metal foil 24 on the second polyimide layer 23 may be patterned by the steps including exposure, development, etching and photoresist removal, to prepare an individual circuit unit. Then, a coverlay 22 and 25 may be optionally applied to the patterned first metal foil 21 and/or second metal foil 24 to protect the circuit unit, and an ENIG process (not shown in the figure) may also be carried out as desired. Subsequently, in step (e), two single-side wired flexible circuit boards 200 and 210 are formed by separation at the interface between the first polyimide layer 20 and the second polyimide layer 23 (see FIG. 2).

Figure 3:
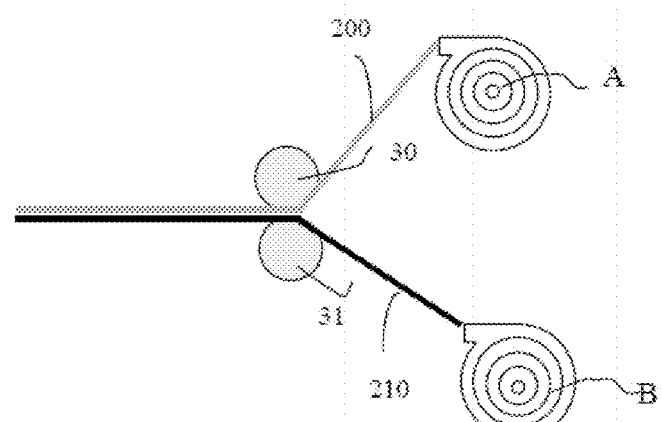
FIG. 3 is a schematic view showing the separation of two single-side wired flexible circuit boards according to the present disclosure.

Due to the presence of an appropriate but not overly high peeling strength (ranging from 3 to 100 gf/cm) at the interface between the first polyimide layer and the second polyimide layer, in step (e), two single-sided flexible circuit boards 200 and 210 are debonded by a roll-to-roll process at the interface with the aid of rollers 30 and 31, and wound into rolls A and B of single-sided flexible circuit board (see FIG. 3, a schematic view showing the separation of two single-sided wired flexible circuit boards).

It should be understood by those skilled in the art that due to the presence of metal foils on both sides, the metal clad laminate of the present disclosure is useful not only in the preparation of a single-sided flexible circuit board, but also in the preparation of a double-sided flexible circuit board, especially when the first polyimide layer and the second polyimide layer have a peeling strength that is greater than 100 gf/cm at the interface therebetween.

Therefore, the present disclosure further provides a method for preparing a double-sided flexible circuit board by using the double-sided two-layer metal clad laminate, which further comprises the steps of:

(f) forming at least one circuit unit respectively on the surface of the first metal foil and the second metal foil of the metal clad laminate.

The method for forming the circuit unit in step (f) is as described in step (d). The wires formed on the upper and lower sides can electrically connect to each other using any suitable method known to those skilled in the art, for example, but not limited thereto, by etching the exposed first polyimide layer and second polyimide layer after step (d) to form a via hole, sputtering a seed layer in the via hole and then plating a conductive component.

In view of the above, by using the polyimide resin of the present disclosure, the present disclosure provides a novel metal clad laminate, which not only has the advantages of a single-sided laminate, i.e., being light and thin, and but also has the advantages of a double-sided laminate, i.e., being useful for circuit fabrication simultaneously on both sides. In addition, the metal clad laminate of the present disclosure is applicable to the preparation of either a single-sided flexible circuit board or a double-sided flexible circuit board, thus having a broader range of applications compared with the existing single-sided FCCLs or double-sided FCCLs. Moreover, the metal clad laminate of the present disclosure is simple to prepare and low in cost, thus having economic advantages.

Preferred embodiments of the present disclosure are disclosed as above, which, however, are provided for further illustrating instead of limiting the scope of the present disclosure. Any modifications and variations easily made by those of skill in the art are contemplated within the disclosure of the specification and the scope of the appended claims of the present disclosure.

EXAMPLES

The abbreviations mentioned in examples below are defined as follows:

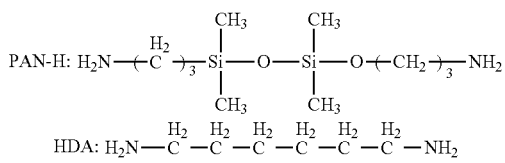

Example 1

58.84 g (0.2 mol) of 3,3',4,4'-biphenyltetracarboxylic dianhydride (BPDA) and 43.62 g (0.2 mol) of pyromellitic dianhydride (PMDA) were dissolved in 2064 g of NMP. 2.32 g (0.02 mol) of 2-hydroxyethyl acrylate (HEA) was slowly added dropwise, and reacted for 2 hrs at 50° C. with stirring. Then, 20.02 g (0.1 mol) of 4,4'-oxydianiline (ODA), 24.85 g (0.1 mol) of PAN-H and 21.63 g (0.2 mol) of p-phenylene diamine (PPDA) were added to the solution, and reacted for 6 hrs at 50° C. with stirring after complete dissolution, to obtain a solution containing a first polymer precursor.

Then, 176.53 g (0.6 mol) of BPDA was added to the solution, stirred for 30 mins, followed by the addition of 64.89 g (0.6 mol) of PPDA, and then reacted for 6 hrs at 50° C. with stirring after complete dissolution, to form a second polymer precursor. The resulting formulation PAA-A1 contained the first polymer precursor and the second polymer precursor, and had a solids content of 20%. The first polymer precursor accounted for 40 mol % of the moles of the total polymer precursors.

The formulation PAA-A1 was coated onto a copper foil (NVP copper foil, ⅓ oz (12 μm), provided by NAN YA company), heated at 150° C. for 5 min, and then heated for 120 min in a nitrogen oven at 350° C., to obtain a single-sided copper clad laminate with a polyimide coating of the present disclosure. The polyimide coating is about 12 μm thick.

Example 2

58.84 g (0.2 mol) of BPDA and 43.62 g (0.2 mol) of PMDA were dissolved in 2059 g of NMP. 2.32 g (0.02 mol) of HEA was slowly added dropwise, and reacted for 2 hrs at 50° C. with stirring. Then, 24.03 g (0.12 mol) of ODA, 19.88 g (0.08 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 64.89 g (0.6 mol) of PPDA, and then reacted for 6 hrs at 50° C. with stirring after complete dissolution, to form a second polymer precursor. The resulting formulation PAA-A2 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A2 onto a copper foil to obtain a single-sided copper clad laminate.

Example 3

58.84 g (0.2 mol) of BPDA and 43.62 g (0.2 mol) of PMDA were dissolved in 2054 g of NMP. 2.32 g (0.02 mol) of HEA was slowly added dropwise, and reacted for 2 hrs at 50° C. with stirring. Then, 28.03 g (0.14 mol) of ODA, 14.91 g (0.06 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 64.89 g (0.6 mol) of PPDA, and then reacted for 6 hrs at 50° C. with stirring after complete dissolution, to form a second polymer precursor. The resulting formulation PAA-A3 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A3 onto a copper foil to obtain a single-sided copper clad laminate.

Example 4

58.84 g (0.2 mol) of BPDA and 43.62 g (0.2 mol) of PMDA were dissolved in 2049 g of NMP. 2.32 g (0.02 mol) of HEA was slowly added dropwise, and reacted for 2 hrs at 50° C. with stirring. Then, 32.04 g (0.16 mol) of ODA, 9.94 g (0.04 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 64.89 g (0.6 mol) of PPDA, and then reacted for 6 hrs at 50° C. with stirring after complete dissolution, to form a second polymer precursor. The resulting formulation PAA-A4 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A4 onto a copper foil to obtain a single-sided copper clad laminate.

Example 5

58.84 g (0.2 mol) of BPDA and 43.62 g (0.2 mol) of PMDA were dissolved in 2044 g of NMP. 2.32 g (0.02 mol) of HEA was slowly added dropwise, and reacted for 2 hrs at 50° C. with stirring. Then, 36.04 g (0.18 mol) of ODA, 4.97 g (0.02 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 64.89 g (0.6 mol) of PPDA, and then reacted for 6 hrs at 50° C. with stirring after complete dissolution, to form a second polymer precursor. The resulting formulation PAA-A5 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A5 onto a copper foil to obtain a single-sided copper clad laminate.

Example 6

58.84 g (0.2 mol) of BPDA and 43.62 g (0.2 mol) of PMDA were dissolved in 2192 g of NMP. 2.32 g (0.02 mol) of HEA was slowly added dropwise, and reacted for 2 hrs at 50° C. with stirring. Then, 28.03 g (0.14 mol) of ODA, 14.91 g (0.06 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 32.44 g (0.3 mol) of PPDA and 60.07 g (0.3 mol) of ODA, and then reacted for 6 hrs at 50° C. with stirring after complete dissolution, to form a second polymer precursor. The resulting formulation PAA-A6 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A6 onto a copper foil to obtain a single-sided copper clad laminate.

Example 7

58.84 g (0.2 mol) of BPDA and 43.62 g (0.2 mol) of PMDA were dissolved in 2146 g of NMP. 2.32 g (0.02 mol) of HEA was slowly added dropwise, and reacted for 2 hrs at 50° C. with stirring. Then, 28.03 g (0.14 mol) of ODA, 14.91 g (0.06 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 43.26 g (0.4 mol) of PPDA and 40.05 g (0.2 mol) of ODA, and then reacted for 6 hrs at 50° C. with stirring after complete dissolution, to form a second polymer precursor. The resulting formulation PAA-A7 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A7 onto a copper foil to obtain a single-sided copper clad laminate.

Example 8

58.84 g (0.2 mol) of BPDA and 43.62 g (0.2 mol) of PMDA were dissolved in 2100 g of NMP. 2.32 g (0.02 mol) of HEA was slowly added dropwise, and reacted for 2 hrs at 50° C. with stirring. Then, 28.03 g (0.14 mol) of ODA, 14.91 g (0.06 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 54.07 g (0.5 mol) of PPDA and 20.02 g (0.1 mol) of ODA, and then reacted for 6 hrs at 50° C. with stirring after complete dissolution, to form a second polymer precursor. The resulting formulation PAA-A8 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A8 onto a copper foil to obtain a single-sided copper clad laminate.

Example 9

58.84 g (0.2 mol) of BPDA and 43.62 g (0.2 mol) of PMDA were dissolved in 2077 g of NMP. 2.32 g (0.02 mol) of HEA was slowly added dropwise, and reacted for 2 hrs at 50° C. with stirring. Then, 28.03 g (0.14 mol) of ODA, 14.91 g (0.06 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 59.48 g (0.55 mol) of PPDA and 10.01 g (0.05 mol) of ODA, and then reacted for 6 hrs at 50° C. with stirring after complete dissolution, to form a second polymer precursor. The resulting formulation PAA-A9 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A9 onto a copper foil to obtain a single-sided copper clad laminate.

Example 10

58.84 g (0.2 mol) of BPDA and 43.62 g (0.2 mol) of PMDA were dissolved in 2016 g of NMP. 2.32 g (0.02 mol) of HEA was slowly added dropwise, and reacted for 2 hrs at 50° C. with stirring. Then, 28.03 g (0.14 mol) of ODA, 14.91 g (0.06 mol) of PAN-H and 21.63 g (0.2 mol) of PPDA were added to the solution, and reacted for 6 hrs at 50° C. with stirring after complete dissolution, to obtain a solution containing a first polymer precursor.

21.81 g (0.1 mol) of PMDA and 147.11 g (0.5 mol) of BPDA were added to the solution, stirred for 30 mins, followed by the addition of 64.89 g (0.6 mol) of PPDA, and then reacted for 6 hrs at 50° C. with stirring after complete dissolution, to form a second polymer precursor. The resulting formulation PAA-A10 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A10 onto a copper foil to obtain a single-sided copper clad laminate.

Example 11

58.84 g (0.2 mol) of BPDA and 43.62 g (0.2 mol) of PMDA were dissolved in 1978 g of NMP. 2.32 g (0.02 mol) of HEA was slowly added dropwise, and reacted for 2 hrs at 50° C. with stirring. Then, 28.03 g (0.14 mol) of ODA, 14.91 g (0.06 mol) of PAN-H and 21.63 g (0.2 mol) of PPDA were added to the solution, and reacted for 6 hrs at 50° C. with stirring after complete dissolution, to obtain a solution containing a first polymer precursor.

43.62 g (0.2 mol) of PMDA and 117.69 g (0.4 mol) of BPDA were added to the solution, stirred for 30 mins, followed by the addition of 64.89 g (0.6 mol) of PPDA, and then reacted for 6 hrs at 50° C. with stirring after complete dissolution, to form a second polymer precursor. The resulting formulation PAA-A11 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A11 onto a copper foil to obtain a single-sided copper clad laminate.

Example 12

58.84 g (0.2 mol) of BPDA and 43.62 g (0.2 mol) of PMDA were dissolved in 2014 g of NMP. 2.32 g (0.02 mol) of HEA was slowly added dropwise, and reacted for 2 hrs at 50° C. with stirring. Then, 28.03 g (0.14 mol) of ODA, 6.97 g (0.06 mol) of HDA and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA were added to the solution, stirred for 30 mins, followed by the addition of 64.89 g (0.6 mol) of PPDA, and then reacted for 6 hrs at 50° C. with stirring after complete dissolution, to form a second polymer precursor. The resulting formulation PAA-A12 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-A12 onto a copper foil to obtain a single-sided copper clad laminate.

Example 13

14.71 g (0.05 mol) of BPDA and 10.91 g (0.05 mol) of PMDA were dissolved in 2032 g of NMP. 2.32 g (0.02 mol)

of HEA was slowly added dropwise, and reacted for 2 hrs at 50° C. with stirring. Then, 6.01 g (0.03 mol) of ODA, 4.97 g (0.02 mol) of PAN-H and 5.41 g (0.05 mol) of PPDA were added to the solution, and reacted for 6 hrs at 50° C. with stirring after complete dissolution, to obtain a solution containing a first polymer precursor.

264.8 g (0.9 mol) of BPDA were added to the solution, stirred for 30 mins, followed by the addition of 97.33 g (0.9 mol) of PPDA, and then reacted for 6 hrs at 50° C. with stirring after complete dissolution, to form a second polymer precursor. The resulting formulation PAA-A13 contained the first polymer precursor and the second polymer precursor, and had a solids content of 20%. The first polymer precursor accounted for 10 mol % of the moles of the total polymer precursors.

Then, the process as describe in Example 1 was used to apply the formulation PAA-A13 onto a copper foil to obtain a single-sided copper clad laminate.

Example 14

22.07 g (0.075 mol) of BPDA and 16.36 g (0.075 mol) of PMDA were dissolved in 2032 g of NMP. 2.32 g (0.02 mol) of HEA was slowly added dropwise, and reacted for 2 hrs at 50° C. with stirring. Then, 10.01 g (0.05 mol) of ODA, 4.97 g (0.02 mol) of PAN-H and 8.65 g (0.08 mol) of PPDA were added to the solution, and reacted for 6 hrs at 50° C. with stirring after complete dissolution, to obtain a solution containing a first polymer precursor.

250.09 g (0.85 mol) of BPDA were added to the solution, stirred for 30 mins, followed by the addition of 91.92 g (0.85 mol) of PPDA, and then reacted for 6 hrs at 50° C. with stirring after complete dissolution, to form a second polymer precursor. The resulting formulation PAA-A14 contained the first polymer precursor and the second polymer precursor, and had a solids content of 20%. The first polymer precursor accounted for 15 mol % of the moles of the total polymer precursors.

Then, the process as describe in Example 1 was used to apply the formulation PAA-A14 onto a copper foil to obtain a single-sided copper clad laminate.

Example 15

29.42 g (0.1 mol) of BPDA and 21.81 g (0.1 mol) of PMDA were dissolved in 2039 g of NMP. 2.32 g (0.02 mol) of HEA was slowly added dropwise, and reacted for 2 hrs at 50° C. with stirring. Then, 14.02 g (0.07 mol) of ODA, 7.46 g (0.03 mol) of PAN-H and 10.81 g (0.1 mol) of PPDA were added to the solution, and reacted for 6 hrs at 50° C. with stirring after complete dissolution, to obtain a solution containing a first polymer precursor.

235.38 g (0.8 mol) of BPDA were added to the solution, stirred for 30 mins, followed by the addition of 86.51 g (0.8 mol) of PPDA, and then reacted for 6 hrs at 50° C. with stirring after complete dissolution, to form a second polymer precursor. The resulting formulation PAA-A15 contained the first polymer precursor and the second polymer precursor, and had a solids content of 20%. The first polymer precursor accounted for 20 mol % of the moles of the total polymer precursors.

Then, the process as describe in Example 1 was used to apply the formulation PAA-A15 onto a copper foil to obtain a single-sided copper clad laminate.

Example 16

36.78 g (0.125 mol) of BPDA and 27.27 g (0.125 mol) of PMDA were dissolved in 2038 g of NMP. 2.32 g (0.02 mol) of HEA was slowly added dropwise, and reacted for 2 hrs at 50° C. with stirring. Then, 18.02 g (0.09 mol) of ODA, 7.46 g (0.03 mol) of PAN-H and 14.06 g (0.13 mol) of PPDA were added to the solution, and reacted for 6 hrs at 50° C. with stirring after complete dissolution, to obtain a solution containing a first polymer precursor.

220.67 g (0.75 mol) of BPDA were added to the solution, stirred for 30 mins, followed by the addition of 81.11 g (0.75 mol) of PPDA, and then reacted for 6 hrs at 50° C. with stirring after complete dissolution, to form a second polymer precursor. The resulting formulation PAA-A16 contained the first polymer precursor and the second polymer precursor, and had a solids content of 20%. The first polymer precursor accounted for 25 mol % of the moles of the total polymer precursors.

Then, the process as describe in Example 1 was used to apply the formulation PAA-A16 onto a copper foil to obtain a single-sided copper clad laminate.

Example 17

44.13 g (0.15 mol) of BPDA and 32.72 g (0.15 mol) of PMDA were dissolved in 2045 g of NMP. 2.32 g (0.02 mol) of HEA was slowly added dropwise, and reacted for 2 hrs at 50° C. with stirring. Then, 22.03 g (0.11 mol) of ODA, 9.94 g (0.04 mol) of PAN-H and 16.22 g (0.15 mol) of PPDA were added to the solution, and reacted for 6 hrs at 50° C. with stirring after complete dissolution, to obtain a solution containing a first polymer precursor.

205.95 g (0.7 mol) of BPDA were added to the solution, stirred for 30 mins, followed by the addition of 75.7 g (0.7 mol) of PPDA, and then reacted for 6 hrs at 50° C. with stirring after complete dissolution, to form a second polymer precursor. The resulting formulation PAA-A17 contained the first polymer precursor and the second polymer precursor, and had a solids content of 20%. The first polymer precursor accounted for 30 mol % of the moles of the total polymer precursors.

Then, the process as describe in Example 1 was used to apply the formulation PAA-A17 onto a copper foil to obtain a single-sided copper clad laminate.

Example 18

51.49 g (0.175 mol) of BPDA and 38.17 g (0.175 mol) of PMDA were dissolved in 2047 g of NMP. 2.32 g (0.02 mol) of HEA was slowly added dropwise, and reacted for 2 hrs at 50° C. with stirring. Then, 24.03 g (0.12 mol) of ODA, 12.43 g (0.05 mol) of PAN-H and 19.47 g (0.18 mol) of PPDA were added to the solution, and reacted for 6 hrs at 50° C. with stirring after complete dissolution, to obtain a solution containing a first polymer precursor.

191.24 g (0.65 mol) of BPDA were added to the solution, stirred for 30 mins, followed by the addition of 70.29 g (0.65 mol) of PPDA, and then reacted for 6 hrs at 50° C. with stirring after complete dissolution, to form a second polymer precursor. The resulting formulation PAA-A18 contained the first polymer precursor and the second polymer precursor, and had a solids content of 20%. The first polymer precursor accounted for 35 mol % of the moles of the total polymer precursors.

Then, the process as describe in Example 1 was used to apply the formulation PAA-A18 onto a copper foil to obtain a single-sided copper clad laminate.

Example 19

66.2 g (0.225 mol) of BPDA and 49.08 g (0.225 mol) of PMDA were dissolved in 2054 g of NMP. 2.32 g (0.02 mol)

of HEA was slowly added dropwise, and reacted for 2 hrs at 50° C. with stirring. Then, 32.04 g (0.16 mol) of ODA, 14.91 g (0.06 mol) of PAN-H and 24.87 g (0.23 mol) of PPDA were added to the solution, and reacted for 6 hrs at 50° C. with stirring after complete dissolution, to obtain a solution containing a first polymer precursor.

161.82 g (0.55 mol) of BPDA were added to the solution, stirred for 30 mins, followed by the addition of 59.48 g (0.55 mol) of PPDA, and then reacted for 6 hrs at 50° C. with stirring after complete dissolution, to form a second polymer precursor. The resulting formulation PAA-A19 contained the first polymer precursor and the second polymer precursor, and had a solids content of 20%. The first polymer precursor accounted for 45 mol % of the moles of the total polymer precursors.

Then, the process as describe in Example 1 was used to apply the formulation PAA-A19 onto a copper foil to obtain a single-sided copper clad laminate.

Example 20

44.13 g (0.15 mol) of BPDA and 32.72 g (0.15 mol) of PMDA were dissolved in 2050 g of NMP. 2.32 g (0.02 mol) of HEA was slowly added dropwise, and reacted for 2 hrs at 50° C. with stirring. Then, 6.01 g (0.03 mol) of ODA, 24.85 g (0.1 mol) of PAN-H and 18.38 g (0.17 mol) of PPDA were added to the solution, and reacted for 6 hrs at 50° C. with stirring after complete dissolution, to obtain a solution containing a first polymer precursor.

205.95 g (0.7 mol) of BPDA were added to the solution, stirred for 30 mins, followed by the addition of 75.7 g (0.7 mol) of PPDA, and then reacted for 6 hrs at 50° C. with stirring after complete dissolution, to form a second polymer precursor. The resulting formulation PAA-A20 contained the first polymer precursor and the second polymer precursor, and had a solids content of 20%. The first polymer precursor accounted for 30 mol % of the moles of the total polymer precursors.

Then, the process as describe in Example 1 was used to apply the formulation PAA-A20 onto a copper foil to obtain a single-sided copper clad laminate.

Example 21

36.78 g (0.125 mol) of BPDA and 27.27 g (0.125 mol) of PMDA were dissolved in 2051 g of NMP. 2.32 g (0.02 mol) of HEA was slowly added dropwise, and reacted for 2 hrs at 50° C. with stirring. Then, 2 g (0.01 mol) of ODA, 24.85 g (0.1 mol) of PAN-H and 15.14 g (0.14 mol) of PPDA were added to the solution, and reacted for 6 hrs at 50° C. with stirring after complete dissolution, to obtain a solution containing a first polymer precursor.

220.67 g (0.75 mol) of BPDA were added to the solution, stirred for 30 mins, followed by the addition of 81.11 g (0.75 mol) of PPDA, and then reacted for 6 hrs at 50° C. with stirring after complete dissolution, to form a second polymer precursor. The resulting formulation PAA-A21 contained the first polymer precursor and the second polymer precursor, and had a solids content of 20%. The first polymer precursor accounted for 25 mol % of the moles of the total polymer precursors.

Then, the process as describe in Example 1 was used to apply the formulation PAA-A21 onto a copper foil to obtain a single-sided copper clad laminate.

Comparative Example 1 [Tg1<270° C., Tg2: 423° C., Soft Segments Accounted for ~40% of the Total]

58.84 g (0.2 mol) of BPDA and 43.62 g (0.2 mol) of PMDA were dissolved in 2076 g of NMP. 2.32 g (0.02 mol) of HEA was slowly added dropwise, and reacted for 2 hrs at 50° C. with stirring. Then, 4 g (0.02 mol) of ODA, 44.74 g (0.18 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 64.89 g (0.6 mol) of PPDA, and then reacted for 6 hrs at 50° C. with stirring after complete dissolution, to form a second polymer precursor. The resulting formulation PAA-B1 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-B1 onto a copper foil to obtain a single-sided copper clad laminate.

Comparative Example 2 [Tg1>315° C., Tg2: 423° C., Soft Segments Accounted for ~40% of the Total]

58.84 g (0.2 mol) of BPDA and 43.62 g (0.2 mol) of PMDA were dissolved in 2042 g of NMP. 2.32 g (0.02 mol) of HEA was slowly added dropwise, and reacted for 2 hrs at 50° C. with stirring. Then, 38.05 g (0.19 mol) of ODA, 2.49 g (0.01 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 64.89 g (0.6 mol) of PPDA, and then reacted for 6 hrs at 50° C. with stirring after complete dissolution, to form a second polymer precursor. The resulting formulation PAA-B2 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-B2 onto a copper foil to obtain a single-sided copper clad laminate.

Comparative Example 3 [Tg1: 292° C., Tg2<350° C., Soft Segments Accounted for ~40% of the Total]

58.84 g (0.2 mol) of BPDA and 43.62 g (0.2 mol) of PMDA were dissolved in 2146 g of NMP. 2.32 g (0.02 mol) of HEA was slowly added dropwise, and reacted for 2 hrs at 50° C. with stirring. Then, 28.03 g (0.14 mol) of ODA, 14.91 g (0.06 mol) of PAN-H and 21.63 g (0.2 mol) of PPDA were added to the solution, and reacted for 6 hrs at 50° C. with stirring after complete dissolution, to obtain a solution containing a first polymer precursor.

176.53 g (0.6 mol) of BPDA was added to the solution, stirred for 30 mins, followed by the addition of 43.26 g (0.4 mol) of PPDA and 40.05 g (0.2 mol) of ODA, and then reacted for 6 hrs at 50° C. with stirring after complete dissolution, to form a second polymer precursor. The resulting formulation PAA-B3 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-B3 onto a copper foil to obtain a single-sided copper clad laminate.

Comparative Example 4 [Tg1: 293° C., Tg2>450° C., Soft Segments Accounted for ~40% of the Total]

58.84 g (0.2 mol) of BPDA and 43.62 g (0.2 mol) of PMDA were dissolved in 1940 g of NMP. 2.32 g (0.02 mol) of HEA was slowly added dropwise, and reacted for 2 hrs at 50° C. with stirring. Then, 28.03 g (0.14 mol) of ODA, 14.91 g (0.06 mol) of PAN-H and 21.63 g (0.2 mol) of PPDA were added to the solution, and reacted for 6 hrs at 50° C. with stirring after complete dissolution, to obtain a solution containing a first polymer precursor.

65.44 g (0.3 mol) of PMDA and 88.27 g (0.3 mol) of BPDA were added to the solution, stirred for 30 mins, followed by the addition of 64.891 g (0.6 mol) of PPDA, and then reacted for 6 hrs at 50° C. with stirring after complete dissolution, to form a second polymer precursor. The resulting formulation PAA-B4 contained the first polymer precursor and the second polymer precursor, and had a solids content of 20%. The first polymer precursor accounted for 40 mol % of the moles of the total polymer precursors.

Then, the process as describe in Example 1 was used to apply the formulation PAA-B4 onto a copper foil to obtain a single-sided copper clad laminate.

Comparative Example 5 [Tg1: 293° C., Tg2: None, Soft Segments Accounted for 100% of the Total]

147.11 g (0.5 mol) of BPDA and 109.06 g (0.5 mol) of PMDA were dissolved in 2065 g of NMP. 2.32 g (0.02 mol) of HEA was slowly added dropwise, and reacted for 2 hrs at 50° C. with stirring. Then, 70.08 g (0.35 mol) of ODA, 24.85 g (0.1 mol) of PAN-H and 59.48 g (0.55 mol) of PPDA were added to the solution, and reacted for 6 hrs at 50° C. with stirring after complete dissolution, to obtain a formulation PAA-B5 containing a first polymer precursor and had a solids content of 20%. The first polymer precursor accounted for 100 mol % of the moles of the total polymer precursors.

Then, the process as describe in Example 1 was used to apply the formulation PAA-B5 onto a copper foil to obtain a single-sided copper clad laminate.

Comparative Example 6 [Tg1: None, Tg2: 423° C., Soft Segments Accounted for 0% of the Total]

294.22 g (1 mol) of BPDA was dissolved in 2012 g of NMP. 2.32 g (0.02 mol) of HEA was slowly added dropwise, and reacted for 2 hrs at 50° C. with stirring. Then, 108.14 g (1 mol) of PPDA was added to the solution, and reacted for 6 hrs at 50° C. with stirring after complete dissolution, to obtain a formulation PAA-B6 which contained a second polymer precursor and did not contain a first polymer precursor and had a solids content of 20%.

Then, the process as describe in Example 1 was used to apply the formulation PAA-B6 onto a copper foil to obtain a single-sided copper clad laminate.

Comparative Example 7 [Tg1: None, Tg2: 330° C., Soft Segments Accounted for 0% of the Total]

235.38 g (0.8 mol) of BPDA and 43.62 g (0.2 mol) of PMDA were dissolved in 2085 g of NMP. 2.32 g (0.02 mol) of HEA was slowly added dropwise, and reacted for 2 hrs at 50° C. with stirring. Then, 60.07 g (0.3 mol) of ODA and 75.7 g (0.7 mol) of PPDA was added to the solution, and reacted for 6 hrs at 50° C. with stirring after complete dissolution, to obtain a formulation PAA-B7 which contained a second polymer precursor and did not contain a first polymer precursor and had a solids content of 20%.

Then, the process as describe in Example 1 was used to apply the formulation PAA-B7 onto a copper foil to obtain a single-sided copper clad laminate.

<Test Methods>

Measurement of Glass Transition Temperature (Tg) of Polyimide:

A polyimide layer was removed from a single-sided metal clad laminate, and measured for Tg by using a thermal mechanical analyzer (TMA, TA Q400 from Texas Instruments). The measurement range was from 0 to 500° C., and the temperature ramping rate was 10° C./min.

Measurement of Coefficient of Thermal Expansion (CTE) of Polyimide:

A polyimide layer was removed from a single-sided metal clad laminate, and measured for CTE by using a thermal mechanical analyzer (TMA, TA Q400 from Texas Instruments). The measurement range was from 0 to 500° C., and the temperature ramping rate was 10° C./min.

Measurement of Peeling Strength A (Peeling Strength Between Two Polyimide Layers of a Quasi Double-Sided Two-Layer Metal Clad Laminate):

Two single-sided copper clad laminates fabricated in the above examples or comparative examples were superposed with the polyimide layers as internal layers and the copper foils as external layers, then laminated by heated rollers under a line pressure of 20 kgf/cm at a lamination temperature of 360° C., and then cooled, to obtain a quasi double-sided two-layer metal clad laminate.

The above-mentioned line pressure refers to a force for lamination applied by two rollers in a roller heat press machine onto a substrate with a constant width divided by the width of the substrate and thus is the line pressure for lamination.

The quasi double-sided two-layer metal clad laminate obtained after lamination were cut into test strips of 15 cm×1 cm. The two polyimide layers at an end of the test strip were slightly separated, and clipped respectively in a clamping fixture of a micro-computer aided pulling force tester (HT-9102, Hung Ta Instrument Co., Ltd, maximum load: 100 kg). The peeling strength test was conducted by drawing at a vertical angle of 180 degrees between the two slightly separated polyimide layers with a distance of 1 cm from one to the other clamping fixture.

Measurement of Peeling Strength B (Peeling Strength Between Two Polyimide Layers of a Double-Sided Two-Layer Metal Clad Laminate):

Two single-sided copper clad laminates fabricated in the above examples or comparative examples were superposed with the polyimide layers as internal layers and the copper foils as external layers, then laminated by heated rollers under a line pressure of 190 kgf/cm at a lamination temperature of 380° C., and then cooled, to obtain a double-sided two-layer metal clad laminate.

The above-mentioned line pressure refers to a force for lamination applied by two rollers in a roller heat press machine onto a substrate with a constant width divided by the width of the substrate and thus is the line pressure for lamination.

The double-sided two-layer metal clad laminate obtained after lamination were cut into test strips of 15 cm×1 cm. The two polyimide layers at an end of the test strip were slightly separated, and clipped respectively in a clamping fixture of a micro-computer aided pulling force tester (HT-9102, Hung Ta Instrument Co., Ltd, maximum load: 100 kg). The peeling strength test was conducted by drawing at a vertical angle of 180 degrees between the two slightly separated polyimide layers with a distance of 1 cm from one to the other clamping fixture.

Measurement of Tensile Strength:

The tensile strength test is to measure the mechanical property of the polyimide film of the single-sided copper clad laminate of the examples and comparative examples after the removal of the copper foil by using a universal tensile strength tester according to the IPC-TM-650 (2.4.19) method. The test result is acceptable if the tensile strength is higher than 100 Mpa.

Flame Retardance Test:

The flame retardance test was carried out on the polyimide film according to the UL94 standard.

<Test Results>

Relevant test results for the above examples and comparative examples are shown in Table 1:

TABLE 1

| | | Ex1 | Ex2 | Ex3 | Ex4 | Ex5 | Ex6 | Ex7 | Ex8 |
|---|---|---|---|---|---|---|---|---|---|
| PI1 | BPDA (mol) | 0.2 | 0.2 | 0.2 | 0.2 | 0.2 | 0.2 | 0.2 | 0.2 |
| | PMDA (mol) | 0.2 | 0.2 | 0.2 | 0.2 | 0.2 | 0.2 | 0.2 | 0.2 |
| | ODA (mol) | 0.1 | 0.12 | 0.14 | 0.16 | 0.18 | 0.14 | 0.14 | 0.14 |
| | PAN-H (mol) | 0.1 | 0.08 | 0.06 | 0.04 | 0.02 | 0.06 | 0.06 | 0.06 |
| | PPDA (mol) | 0.2 | 0.2 | 0.2 | 0.2 | 0.2 | 0.2 | 0.2 | 0.2 |
| | HDA (mol) | 0 | 0 | 0 | 0 | 0 | 0 | 0 | 0 |
| PI2 | PMDA (mol) | 0 | 0 | 0 | 0 | 0 | 0 | 0 | 0 |
| | BPDA (mol) | 0.6 | 0.6 | 0.6 | 0.6 | 0.6 | 0.6 | 0.6 | 0.6 |
| | PPDA (mol) | 0.6 | 0.6 | 0.6 | 0.6 | 0.6 | 0.3 | 0.4 | 0.5 |
| | ODA (mol) | 0 | 0 | 0 | 0 | 0 | 0.3 | 0.2 | 0.1 |
| | Tg1 (° C.) | 271 | 283 | 294 | 303 | 312 | 293 | 295 | 295 |
| | Tg2 (° C.) | 422 | 423 | 421 | 422 | 423 | 356 | 377 | 391 |
| | PI1/PI2 | 40/60 | 40/60 | 40/60 | 40/60 | 40/60 | 40/60 | 40/60 | 40/60 |
| | CTE (ppm/° C.) | 19.1 | 18.7 | 18.1 | 17.6 | 17.4 | 27.4 | 25.8 | 22.9 |
| | Peeling strength A (gf/cm) | 56 | 47 | 32 | 14 | 7 | 25 | 21 | 18 |
| | Peeling strength B (gf/cm) | 383 | 294 | 210 | 148 | 120 | 223 | — | — |
| | Tensile strength (MPa) | 128 | 133 | 136 | 151 | 172 | 114 | 124 | 135 |
| | Flame retardance test | V-0 | V-0 | V-0 | V-0 | V-0 | V-0 | V-0 | V-0 |

| | | Ex9 | Ex10 | Ex11 | Ex12 | Ex13 | Ex14 | Ex15 | Ex16 |
|---|---|---|---|---|---|---|---|---|---|
| PI1 | BPDA (mol) | 0.2 | 0.2 | 0.2 | 0.2 | 0.05 | 0.075 | 0.1 | 0.125 |
| | PMDA (mol) | 0.2 | 0.2 | 0.2 | 0.2 | 0.05 | 0.075 | 0.1 | 0.125 |
| | ODA (mol) | 0.14 | 0.14 | 0.14 | 0.14 | 0.03 | 0.05 | 0.07 | 0.09 |
| | PPDA (mol) | 0.2 | 0.2 | 0.2 | 0.2 | 0.05 | 0.08 | 0.1 | 0.13 |
| | PAN-H (mol) | 0.06 | 0.06 | 0.06 | 0 | 0.02 | 0.02 | 0.03 | 0.03 |
| | HDA (mol) | 0 | 0 | 0 | 0.06 | 0 | 0 | 0 | 0 |
| PI2 | PMDA (mol) | 0 | 0.1 | 0.2 | 0 | 0 | 0 | 0 | 0 |
| | BPDA (mol) | 0.6 | 0.5 | 0.4 | 0.6 | 0.9 | 0.85 | 0.8 | 0.75 |
| | PPDA (mol) | 0.55 | 0.6 | 0.6 | 0.6 | 0.9 | 0.85 | 0.8 | 0.75 |
| | ODA (mol) | 0.05 | 0 | 0 | 0 | 0 | 0 | 0 | 0 |
| | Tg1 (° C.) | 294 | 293 | 292 | 293 | 293 | 293 | 292 | 294 |
| | Tg2 (° C.) | 412 | 431 | 440 | 422 | 421 | 423 | 421 | 421 |
| | PI1/PI2 | 40/60 | 40/60 | 40/60 | 40/60 | 10/90 | 15/85 | 20/80 | 25/75 |
| | CTE (ppm/° C.) | 20.3 | 16.8 | 16.1 | 17.9 | 17.2 | 17.8 | 18.1 | 19.7 |

TABLE 1-continued

|  |  |  |  |  |  |  |  |  |
|---|---|---|---|---|---|---|---|---|
| Peeling strength A (gf/cm) | 19 | 15 | 9 | 36 | 21 | 19 | 22 | 23 |
| Peeling strength B (gf/cm) | — | — | 187 | 236 | 102 | — | 131 | — |
| Tensile strength (MPa) | 147 | 167 | 182 | 169 | 184 | 177 | 158 | 139 |
| Flame retardance test | V-0 | V-0 | V-0 | V-0 | V-0 | V-0 | V-0 | V-0 |

|  |  | Ex17 | Ex18 | Ex19 | Ex20 | Ex21 |
|---|---|---|---|---|---|---|
| PI1 | BPDA (mol) | 0.15 | 0.175 | 0.225 | 0.15 | 0.125 |
|  | PMDA (mol) | 0.15 | 0.175 | 0.225 | 0.15 | 0.125 |
|  | ODA (mol) | 0.11 | 0.12 | 0.16 | 0.03 | 0.01 |
|  | PPDA (mol) | 0.15 | 0.18 | 0.23 | 0.17 | 0.14 |
|  | PAN-H (mol) | 0.04 | 0.05 | 0.06 | 0.1 | 0.1 |
|  | HDA (mol) | 0 | 0 | 0 | 0 | 0 |
| PI2 | PMDA (mol) | 0 | 0 | 0 | 0 | 0 |
|  | BPDA (mol) | 0.7 | 0.65 | 0.55 | 0.7 | 0.75 |
|  | PPDA (mol) | 0.7 | 0.65 | 0.55 | 0.7 | 0.75 |
|  | ODA (mol) | 0 | 0 | 0 | 0 | 0 |
|  | Tg1 (° C.) | 294 | 292 | 292 | 288 | 279 |
|  | Tg2 (° C.) | 421 | 422 | 422 | 421 | 422 |
|  | PI1/PI2 | 30/70 | 35/65 | 45/55 | 30/70 | 25/75 |
|  | CTE (ppm/° C.) | 21.2 | 23.6 | 24.5 | 25.6 | 27.1 |
|  | Peeling strength A (gf/cm) | 25 | 29 | 36 | 31 | 37 |
|  | Peeling strength B (gf/cm) | — | — | 228 | 312 | 328 |
|  | Tensile strength (MPa) | 134 | 129 | 112 | 109 | 101 |
|  | Flame retardance test | V-0 | V-0 | V-0 | V-0 | V-0 |

|  |  | Comp. Ex 1 | Comp. Ex 2 | Comp. Ex 3 | Comp. Ex 4 | Comp. Ex 5 | Comp. Ex 6 | Comp. Ex 7 |
|---|---|---|---|---|---|---|---|---|
| PI1 | BPDA (mol) | 0.2 | 0.2 | 0.2 | 0.2 | 0.5 | 0 | 0 |
|  | PMDA (mol) | 0.2 | 0.2 | 0.2 | 0.2 | 0.5 | 0 | 0 |
|  | ODA (mol) | 0.02 | 0.19 | 0.14 | 0.14 | 0.35 | 0 | 0 |
|  | PPDA (mol) | 0.2 | 0.2 | 0.2 | 0.2 | 0.55 | 0 | 0 |
|  | PAN-H (mol) | 0.18 | 0.01 | 0.06 | 0.06 | 0.1 | 0 | 0 |
|  | RDA (mol) | 0 | 0 | 0 | 0 | 0 | 0 | 0 |
| PI2 | PMDA (mol) | 0 | 0 | 0 | 0.3 | 0 | 0 | 0.2 |
|  | BPDA (mol) | 0.6 | 0.6 | 0.6 | 0.3 | 0 | 1 | 0.8 |
|  | PPDA (mol) | 0.6 | 0.6 | 0.4 | 0.6 | 0 | 1 | 0.7 |
|  | ODA (mol) | 0 | 0 | 0.2 | 0 | 0 | 0 | 0.3 |
|  | Tg1 (° C.) | 263 | 327 | 292 | 293 | 293 | X | X |
|  | Tg2 (° C.) | 423 | 423 | 341 | 455 | X | 423 | 330 |
|  | PI1/PI2 | 40/60 | 40/60 | 40/60 | 40/60 | 100/0 | 0/100 | 0/100 |
|  | CTE (ppm/° C.) | 27.3 | 17.1 | 33.7 | 10.4 | 43.5 | 5.4 | 17.5 |
|  | Peeling strength A (gf/cm) | 145 | 0 | 34 | 32 | 163 | 0 | 0 |
|  | Peeling strength B (gf/cm) | 456 | 0 | 242 | 167 | 465 | 0 | 0 |
|  | Tensile strength (MPa) | 105 | 198 | 127 | 134 | 93 | 215 | 167 |
|  | Flame retardance test | V-1 | V-0 | V-0 | V-0 | V-0 | V-0 | V-0 |

As reported in Table 1, the polyimide layer made according to the examples of the present disclosure has at least two glass transition temperatures wherein the first glass transition temperature is in the range of about 270° C. to about 315° C. and the second glass transition temperature is in the range of about 350° C. to about 450° C. The results reveal that since the polyimide layer of the present disclosure has a coefficient of thermal expansion (in the range of 15 to 30 ppm/° C.) close to that of metal foil, it is u) applicable to a metal clad laminate and can reduce warpage and increase flatness. In addition, the polyimide layer not only has good tensile strength and flame retardance, but also can be used to prepare a quasi double-sided two-layer metal clad laminate or a double-sided two-layer metal clad laminate as needed in the operation temperature and pressure range of a common metal clad laminate by adjusting the pressure and temperature.

Comparative Examples 1, 2, 6 and 7 do not contain the component that can provide the first glass transition temperature in the range of about 270° C. to about 315° C. The peeling strength A in these comparative examples is too high or too low, which shows that they are not applicable to the preparation of a quasi double-sided two-layer metal clad laminate. Comparative Examples 2, 6 and 7 are not applicable to the preparation of a double-sided two-layer metal clad laminate, either.

Comparative Examples 3 to 5 do not contain the component that can provide the second glass transition temperature in the range of about 350° C. to about 450° C. The thermal expansion coefficient of the resulting polyimide layers is too high or too low, and thus they are not applicable to a metal clad laminate.

Finally, it should be noted that the above embodiments are intended to illustrate instead of limit the technical solution of the present disclosure. Although the present disclosure is described in detail by way of examples, it should be understood by those of ordinary skill in the art that modifications may be made to the technical solutions described in the embodiments, and equivalents may be substituted for some or all the technical features, without essentially departing from the scope of the technical solution described in the embodiments of the present disclosure.

What is claimed is:

1. A polyimide resin having at least two glass transition temperatures measured by dynamic mechanical analysis (DMA), which has a first glass transition temperature in the range of 270° C. to 310° C. and a second glass transition temperature in the range of 350° C. to 450° C., wherein the polyimide resin is prepared by polymerizing a plurality of different polyimide precursors to form a single polymer.

2. The polyimide resin according to claim 1, wherein the first glass transition temperature is in the range of 280° C. to 310° C. and the second glass transition temperature is in the range of 370° C. to 445° C.

3. The polyimide resin according to claim 2, wherein the first glass transition temperature is in the range of 285° C. to 305° C.

4. The polyimide resin according to claim 1, wherein the first glass transition temperature comes from a first polyimide and the first polyimide is in an amount of 5 mol % to 50 mole %, based on the total of the polyimide resin components.

5. The polyimide resin according to claim 4, wherein the first polyimide is in an amount of 10 mol % to 45 mole %, based on the total of the polyimide resin components.

6. The polyimide resin according to claim 1, which has a coefficient of thermal expansion in the range of 15 to 30 ppm/° C.

7. The polyimide resin according to claim 1, wherein the first glass transition temperature comes from a first polyimide and the first polyimide comprises a polymerization unit derived from a long-chain diamine monomer and an aromatic diamine monomer, wherein the long-chain diamine monomer comprises

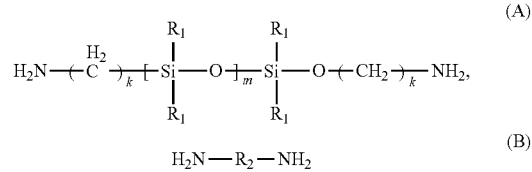

or a combination thereof, wherein each $R_1$ is independently H, $C_1$-$C_4$alkyl, or phenyl; k may be the same or different and is an integer greater than 0; m is an integer greater than 0; and $R_2$ is $C_2$-$C_{14}$alkylene.

8. The polyimide resin according to claim 7, wherein the amount of the long-chain diamine monomer, based on the total moles of the diamine monomers contained in the first polyimide, is from 5 mol % to 40 mol %.

9. The polyimide resin according to claim 7, wherein the second glass transition temperature comes from a second polyimide and the second polyimide comprises a polymerization unit derived from a rigid diamine monomer, wherein the rigid diamine monomer comprises:

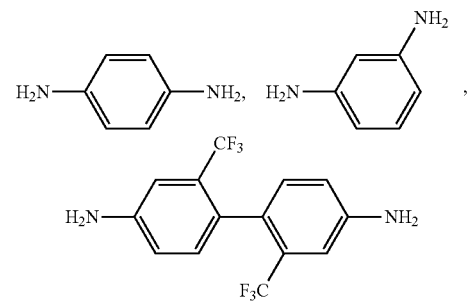

or a combination thereof.

10. The polyimide resin according to claim 1, having adhesion upon hot pressing.

11. The polyimide resin according to claim 1, wherein the single polymer is a block copolymer.

12. The polyimide resin according to claim 1, wherein the polyimide resin is not a blend of polyimides.

13. A metal clad laminate, comprising:
a first metal foil;
a first polyimide layer directly disposed on the first metal foil;
a second metal foil; and
a second polyimide layer directly disposed on the second metal foil;
wherein the first polyimide layer is in contact with the second polyimide layer and wherein the first polyimide layer and/or the second polyimide layer comprises the polyimide resin according to claim 1.

14. The metal clad laminate according to claim 13, wherein a peeling strength between the first polyimide layer and the second polyimide layer is about 3 gf/cm to about 100 gf/cm.

15. A compound which is a polyimide having at least two glass transition temperatures measured by dynamic mechanical analysis (DMA), which has a first glass transition temperature in the range of 270° C. to 310° C. and a second glass transition temperature in the range of 350° C. to 450° C.

16. The compound according to claim 15, wherein the compound is a block copolymer.

* * * * *